United States Patent [19]

Williams

[11] Patent Number: 5,731,732

[45] Date of Patent: *Mar. 24, 1998

[54] GATE DRIVE TECHNIQUE FOR A BIDIRECTIONAL BLOCKING LATERAL MOSFET

[75] Inventor: Richard K. Williams, Cupertino, Calif.

[73] Assignee: Siliconix incorporated, Santa Clara, Calif.

[*] Notice: The term of this patent shall not extend beyond the expiration date of Pat. No. 5,510,747.

[21] Appl. No.: 636,258

[22] Filed: Apr. 22, 1996

Related U.S. Application Data

[63] Continuation of Ser. No. 160,560, Nov. 30, 1993, Pat. No. 5,510,747.

[51] Int. Cl.⁶ .................................................. H03K 17/687
[52] U.S. Cl. ............................ 327/434; 327/365; 327/584
[58] Field of Search .................................... 327/389, 427, 327/428, 429, 430, 434, 534, 535, 536, 537, 584, 334, 362, 363, 365

[56] References Cited

U.S. PATENT DOCUMENTS

| | | | |
|---|---|---|---|
| 4,256,978 | 3/1981 | Pinckaers | 327/434 |
| 4,404,477 | 9/1983 | Chao | 327/541 |
| 4,487,458 | 12/1984 | Janutka | 327/436 |
| 4,857,984 | 8/1989 | Lucas | 327/434 |
| 5,039,877 | 8/1991 | Chern | 327/536 |

FOREIGN PATENT DOCUMENTS 58-16542  9/1983  Japan.

*Primary Examiner*—Timothy P. Callahan
*Assistant Examiner*—Terry L. Englund
*Attorney, Agent, or Firm*—Skjerven, Morrill, MacPherson, Franklin & Friel; David E. Steuber

[57] ABSTRACT

A gate drive circuit for a bidirectional blocking MOSFET, the bidirectional blocking MOSFET being characterized in the source region is not shorted to the body region. In one embodiment, the gate drive circuit includes diodes connected between the source/drain regions and a charge pump, the charge pump generating a gate drive voltage applied to a gate of the bidirectional blocking MOSFET. In a second embodiment, a charge pump generates a gate drive voltage which is applied to the gate of the bidirectional blocking MOSFET, and is also connected to the source/drain regions through zener diodes. In the second embodiment, the potential applied to the gate of the bidirectional blocking MOSFET is limited to a zener diode drop above the lower of the voltages of the source/drain regions. In a fourth embodiment, a charge pump generates a floating gate drive voltage which is applied to gate of the bidirectional blocking MOSFET through first and second depletion mode MOSFETS. In the fourth embodiment, the gate drive voltage is limited to the threshold level of the first and second depletion mode MOSFETs and the voltage present on the more negative of the source/drain regions. In the second and fourth embodiments, the limited gate drive allows for a minimal gate oxide thickness, thereby improving switch resistance.

22 Claims, 20 Drawing Sheets

$V_{cp} = \max \{3V_X - 3V_D, 3V_Y - 3V_D\}$

GATE DRIVE TECHNIQUE FOR A BIDIRECTIONAL BLOCKING LATERAL MOSFET

This application is a continuation of application Ser. No. 08/160,560, filed Nov. 30, 1993, now U.S. Pat. No. 5,510,747.

CROSS REFERENCE TO RELATED APPLICATION

This application is related to application Ser. No. 08/159,900 (now U.S. Pat. No. 5,536,977) and application Ser. No. 08/160,539 (now U.S. Pat. No. 5,420,451), both of which were filed on the same data as the parent application, and both of which are incorporated herein by reference.

FIELD OF THE INVENTION

Users of battery-powered devices such as notebook computers require that the devices be usable for long periods of time between battery recharges. This requirement has led to cascaded battery arrangements, in which a primary battery, a secondary battery, etc., are connected to the device in succession. Frequently an AC/DC converter is also provided to allow the user to conserve battery power when he is near a source of AC power. A connection for an external backup battery may also be provided.

Such an arrangement is illustrated in FIG. 1 wherein a primary battery B1 and a secondary battery B2 are connected via switches S1 and S2, respectively, to a load L, which could be a DC/DC converter supplying, for example, a notebook computer. The supply connections are made through a bus which is designated B.

Also connected to bus B is an AC/DC converter C3 which supplies power through a switch S3. The voltage supplied by primary battery B1 is designated $V_1$, the voltage supplied by secondary battery B2 is designated $V_2$, and the voltage supplied by AC/DC converter C3 is designated $V_3$. A backup battery B4 is also connected to bus B.

In the operation of this multiple battery arrangement, only one of switches S1, S2, and S3 would normally be closed at any given time. The remaining switches would be open. When power is supplied by primary battery B1, for example, switch S1 is closed and switches S2 and S3 are open.

As the power sources are switched in and out, the voltage across switches S1, S2, and S3 can vary both in magnitude and direction. This is illustrated in FIGS. 2A–2C. As shown in FIG. 2A, for example, the output $V_2$ of battery B2 might be 14 V at a given point in time. If battery B2 is then supplying power, the voltage $V_{bus}$ would also equal 14 V. If battery B1 is fully charged, its output voltage $V_1$ might be 18 V. In this case, the left side of switch S1 would be positively charged. On the other hand, assume the same situation except that battery B1 is discharged, so that $V_1$ is 6 V. In this case, the right side of switch S1 is positively charged, as shown in FIG. 2B. A third alternative is illustrated in FIG. 2C where battery B1 is discharged, battery B2 is fully charged, and bus B is supplied by AC/DC converter C1. In the example, $V_1$ is shown as equalling 6 V, $V_2$ is shown as equalling 17 V, and $V_3$ is shown as equalling 12 V. In this case, the right side of switch S1 is positively charged, and the left side of switch S2 is positively charged.

In summary, any of switches S1–S3 may have to withstand a voltage in either direction. The only thing known for certain is that all of the voltages applied to these switches will be above ground.

The device may also be equipped with an internal battery charger, as illustrated in FIG. 3. A battery charger C5 is connected to battery B1 via a switch S4 and to battery B2 via a switch S5. Battery charger C5 may be supplied from the output of AC/DC converter C3 or (optionally) directly from the power main. As illustrated in FIG. 4, battery charger C5 may deliver a voltage as high as 24 V for quick battery charging. In the condition illustrated in FIG. 4, battery B2 is being charged, and the $V_1$ output of battery B1 is equal to 12 volts. Switch S4 therefore must withstand a voltage difference of 12 V. However, since deep discharging of a rechargeable battery is known to extend its life, $V_1$ could drop to below 6 V, in which case switch S4 would need to withstand over 18 V, with its left side being positively charged. On the other hand, when battery charger C5 is not operative it may have a shorted or leaky characteristic, and switches S4 and S5 would then have to block voltages in the other direction. Therefore, switches S4 and S5 must also be bidirectional current blocking.

The foregoing would not represent a problem if switches S1–S5 were mechanical switches. However, it is preferable to use semiconductor technology, and in particular MOSFET technology, in fabricating these switches. Power MOSFETs are typically fabricated with a source-body short to ensure that the intrinsic bipolar transistor (represented by the source, body and drain regions) remains turned off at all times. The prior art teaches generally that a good source-body short is fundamental to reliable parasitic-bipolar-free power MOSFET operation.

The use of a source-body short has the effect of creating a diode across the drain and body terminals of the MOSFET which is electrically in parallel with the MOSFET. For a P-channel device, the cathode of the diode is connected to the drain; for an N-channel device, the anode of the diode is connected to the drain. Thus, a MOSFET must never be exposed to voltages at its source-body and drain terminals which would cause the "antiparallel" diode to become forward-biased. FIGS. 5A–5D illustrate the polarity of the antiparallel diode (shown in hatched lines) for a vertical N-channel DMOS device (FIG. 5A), a vertical P-channel DMOS device (FIG. 5B), a lateral N-channel device (FIG. 5C), and a lateral N-channel DMOS device (FIG. 5D).

Accordingly, conventional MOSFETs are not suitable for switches S1–S5 because they are not capable of blocking bidirectional currents. In FIGS. 2A–2C, for example, the antiparallel diodes across switches S1 and S2 are shown in hatched lines, with their anode and cathode terminals arranged so as would be required to block the flow of current through the switches. If the polarity of the voltages across the switches were reversed, the antiparallel diodes would become forward-biased.

One possible solution to this problem would be to connect two MOSFETs in a back-to-back arrangement, as illustrated schematically in FIGS. 6A–6C. FIG. 6A illustrates a pair of NMOS devices having a common source, FIG. 6B illustrates a pair of NMOS devices having a common drain, and FIG. 6C illustrates a pair of PMOS devices having a common source. These back-to-back arrangements double the on-resistance of the switches, however, and therefore detract significantly from the amount of power delivered to the computer or other device.

Accordingly, what is needed is a bidirectional current blocking MOSFET which has the on-resistance of a normal MOSFET and yet does not contain an antiparallel diode across the drain and body terminals.

In addition, what is needed is a gate drive circuit for the bidirectional blocking MOSFET which allows bidirectional current flow.

SUMMARY OF THE INVENTION

In accordance with this invention, a gate drive circuit is provided for a bidirectional blocking MOSFET. The bidirectional blocking MOSFET includes first and second regions of a first conductivity type separated by a channel region of a second conductivity type, the first and second regions serving as a source and drain of the MOSFET. The bidirectional blocking MOSFET also includes a body region, a gate and a gate oxide layer between the body region and the gate, and is characterized in that neither of the first and second regions are shorted to the body region, and voltages that are applied to the first and second regions are both either higher than or lower than a voltage at which the body region is maintained, thereby preventing forward-biasing of the junctions between the body and the first and second regions.

The gate drive circuit generates a gate voltage which is limited by a maximum voltage supported by the gate oxide layer and is determined by the lowest voltage of the first and second regions.

In accordance with a first embodiment of the present invention, a gate drive circuit for a bidirectional blocking MOSFET includes a first diode having an anode connected to the first region, and a second diode having an anode connected to the second region, a charge pump connected to the cathodes of the first and second diodes, the charge pump generating a gate drive voltage applied to the gate of the bidirectional blocking MOSFET. A grounded zener diode is connected to limit the gate driving voltage to a predetermined maximum value.

In accordance with the first embodiment of the present invention, the gate drive voltage is determined by the higher of the voltages of the first and second regions and is fixed relative to ground. This assures that the gate drive voltage is sufficient to allow bidirectional current flow regardless of the relative voltages on the first and second regions.

In accordance with a second embodiment of the present invention, a charge pump generates a gate drive voltage which is applied to the gate of the bidirectional blocking MOSFET, and is also applied to the first and second regions through a first zener diode having a cathode connected to the gate drive voltage and an anode connected to the first region, and a second zener diode having a cathode connected to the gate drive voltage and an anode connected to the second region. In addition, first and second diodes are connected between the first and second regions and the charge pump.

In accordance with the second embodiment, the potential applied to the gate of the bidirectional blocking MOSFET is limited to a zener diode drop above the lower of the voltages of the first and second regions. This produces a "floating" gate drive voltage which reduces the necessary thickness of the gate oxide layer separating the gate from the first and second regions.

In accordance with a third embodiment of the present invention, a charge pump generates a gate drive voltage which is applied to the gate of the bidirectional blocking MOSFET through a P-channel MOSFET, and is also applied to the first and second regions through a current source, which is connected to a first zener diode having a cathode connected to the gate drive voltage and an anode connected to the first region and a second zener diode having a cathode connected to the gate drive voltage and an anode connected to the second region. The cathodes of the first and second zener diodes are connected to the gate of the P-channel MOSFET. In addition, first and second diodes are connected between the first and second regions and the charge pump. An optional N-channel MOSFET is connected to the gate of the bidirectional MOSFET and connects the gate to ground when the charge pump is disconnected from the P-channel MOSFET.

In accordance with the third embodiment, the potential applied to the gate of the bidirectional blocking MOSFET is limited by the lower of the voltages of the first and second regions through the P-channel MOSFET. This produces a "floating" gate drive voltage, similar to the above-described second embodiment, in which the load on the charge pump is reduced due to the current source. Further, the grounded N-channel MOSFET is turned on when the charge pump is disconnected from the bidirectional blocking MOSFET, thereby connecting the gate of the bidirectional blocking MOSFET to ground.

In accordance with a fourth embodiment of the present invention, a charge pump generates a floating gate drive voltage which is applied to the gate of the bidirectional blocking MOSFET through first and second depletion mode MOSFETS. The drain of the first depletion mode MOSFET is connected to the charge pump through a switch. The drain of the second depletion mode MOSFET is connected to the source of the first MOSFET, and the source of the second MOSFET is connected to the gate of the bidirectional blocking MOSFET. The gate of the first depletion mode MOSFET is connected to the second region and the gate of the second depletion mode MOSFET is connected to the first region. An optional N-channel MOSFET is connected to the gate of the bidirectional MOSFET and connects the gate to ground when the charge pump is disconnected from the first depletion mode MOSFET.

In accordance with a fifth embodiment of the present invention, a P-channel MOSFET is connected between the charge pump and the bidirectional blocking MOSFET, and first and second depletion mode MOSFETS are connected between the charge pump and the gate of the P-channel MOSFET. The drain of the first depletion mode MOSFET is connected to the charge pump through a switch. The drain of the second depletion mode MOSFET is connected to the source of the first MOSFET, and the source of the second MOSFET is connected to the gate of the P-channel MOSFET. The gate of the first depletion mode MOSFET is connected to the second region and the gate of the second depletion mode MOSFET is connected to the first region. An optional N-channel MOSFET is connected to the gate of the bidirectional MOSFET and is turned on when the charge pump is disconnected from the first depletion mode MOSFET.

In accordance with the fourth and fifth embodiments, the gate drive voltage is limited to the threshold level of the first and second depletion mode MOSFETs and the voltage present on the more negative of the first and second regions.

BRIEF DESCRIPTION OF THE DRAWINGS

FIGS. 11A-11C illustrate the relationship between the gate, source and drain regions of a bidirectional blocking MOSFET in an off condition, at turn-on, and after turn-on.

DESCRIPTION OF THE INVENTION

Bidirectional Blocking MOSFET Switches

Figure 1:
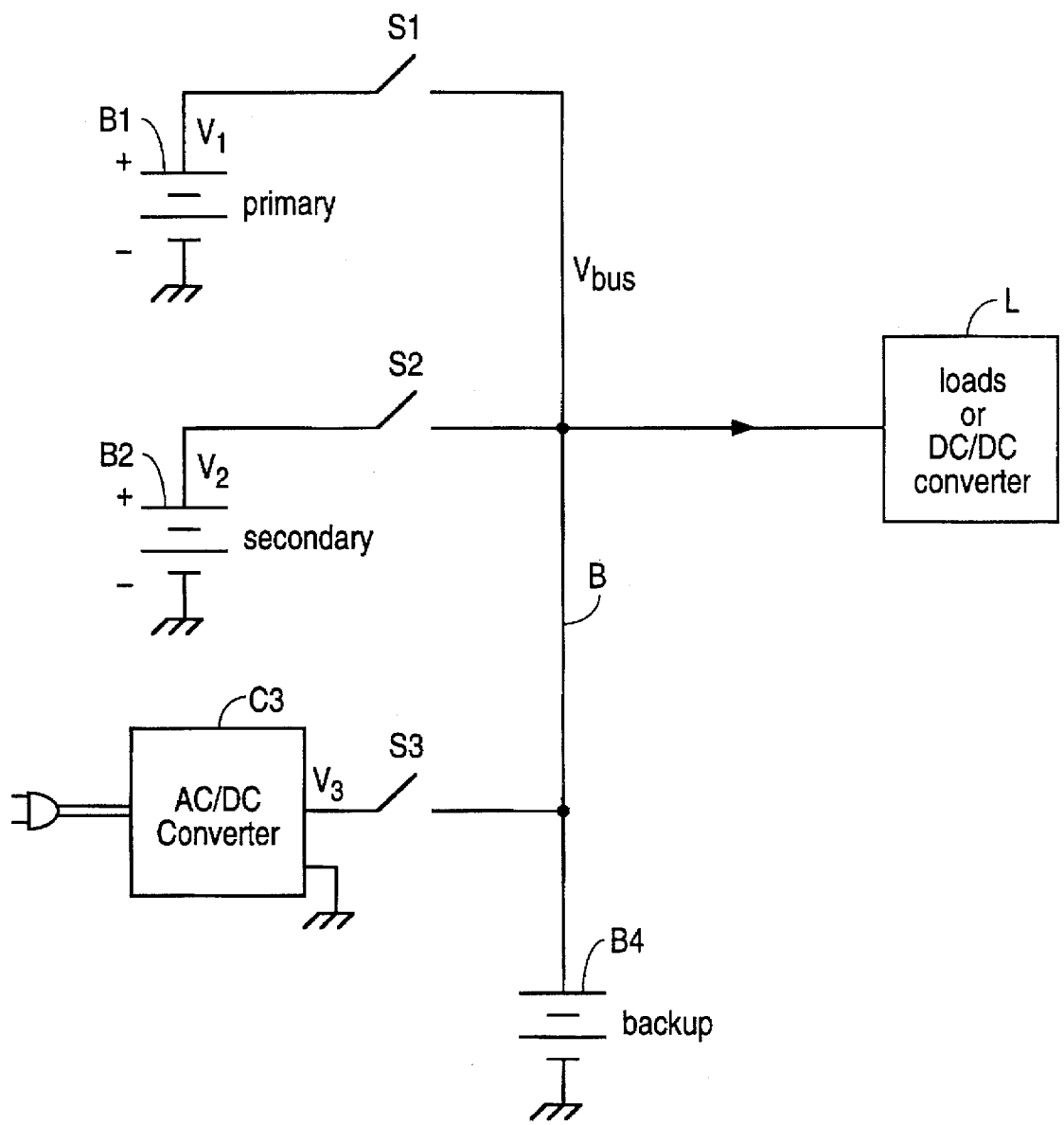
FIG. 1 illustrates a schematic drawing of a multiple battery power supply arrangement, including disconnect switches.
Figure 2A:
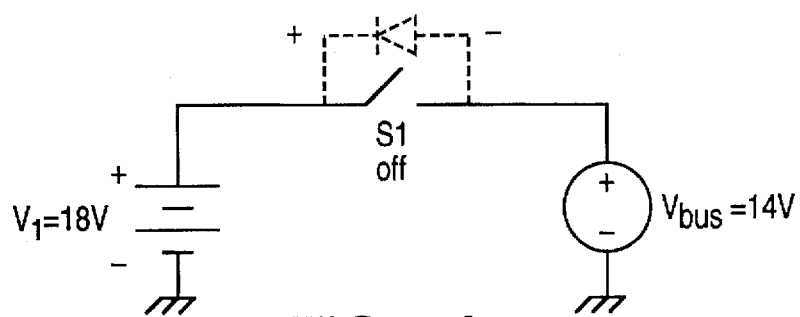
FIGS. 2A, 2B and 2C illustrate possible voltage differences illustrated by the disconnect switches shown in FIG. 1.
Figure 2B:
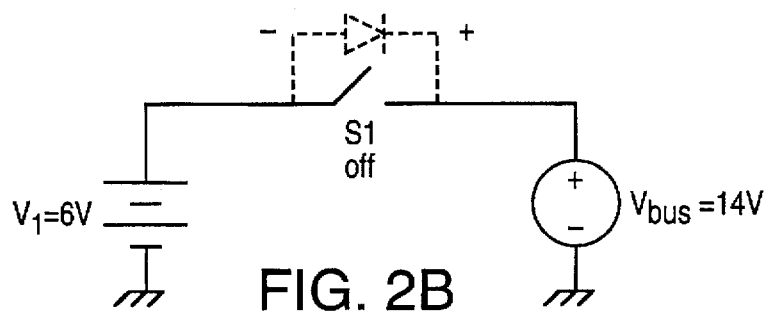
Figure 2C:
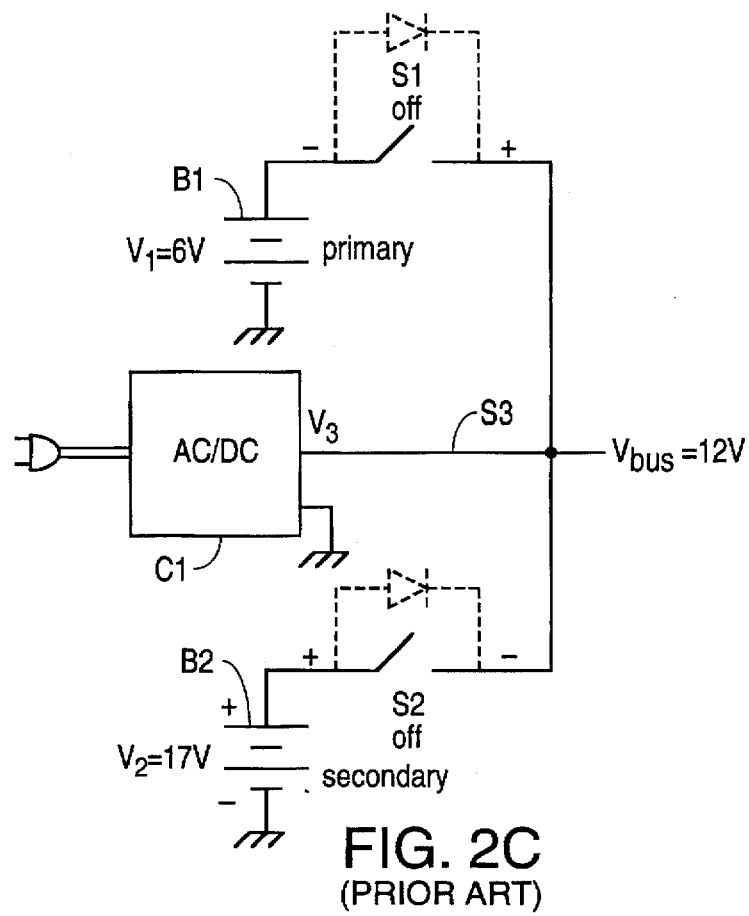
Figure 3:
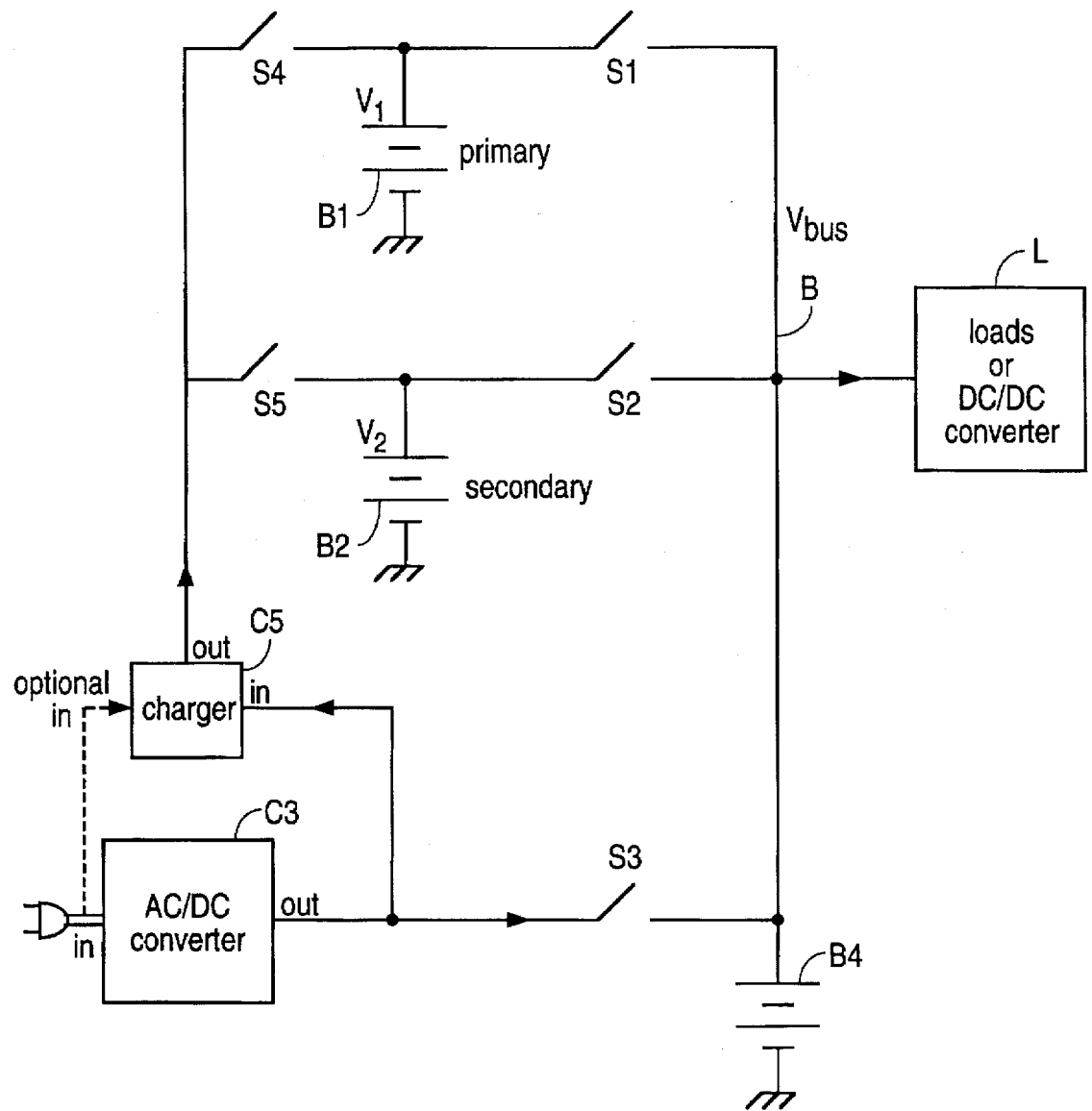
FIG. 3 illustrates a schematic diagram of a multiple battery power supply arrangement, including a battery charger.
Figure 4:
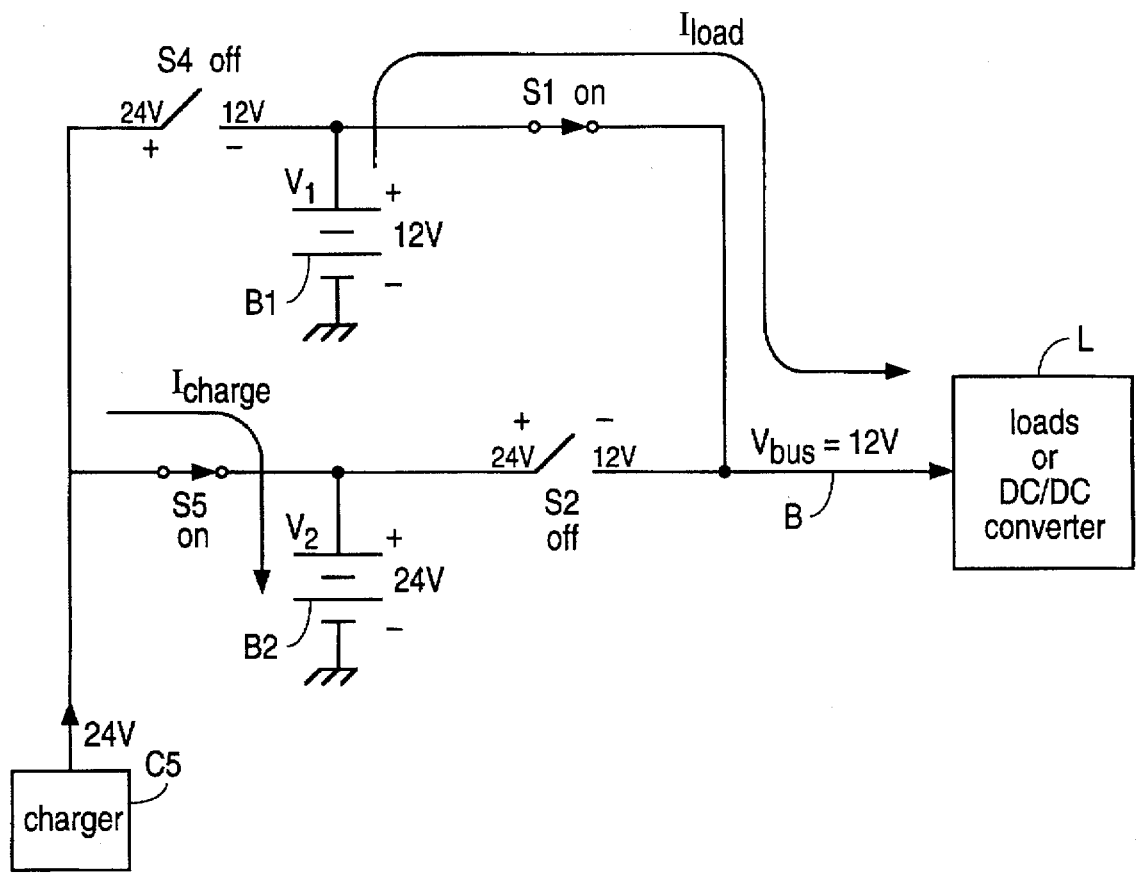
FIG. 4 illustrates possible voltage differences experienced by the disconnect switches shown in FIG. 3.
Figure 5A:
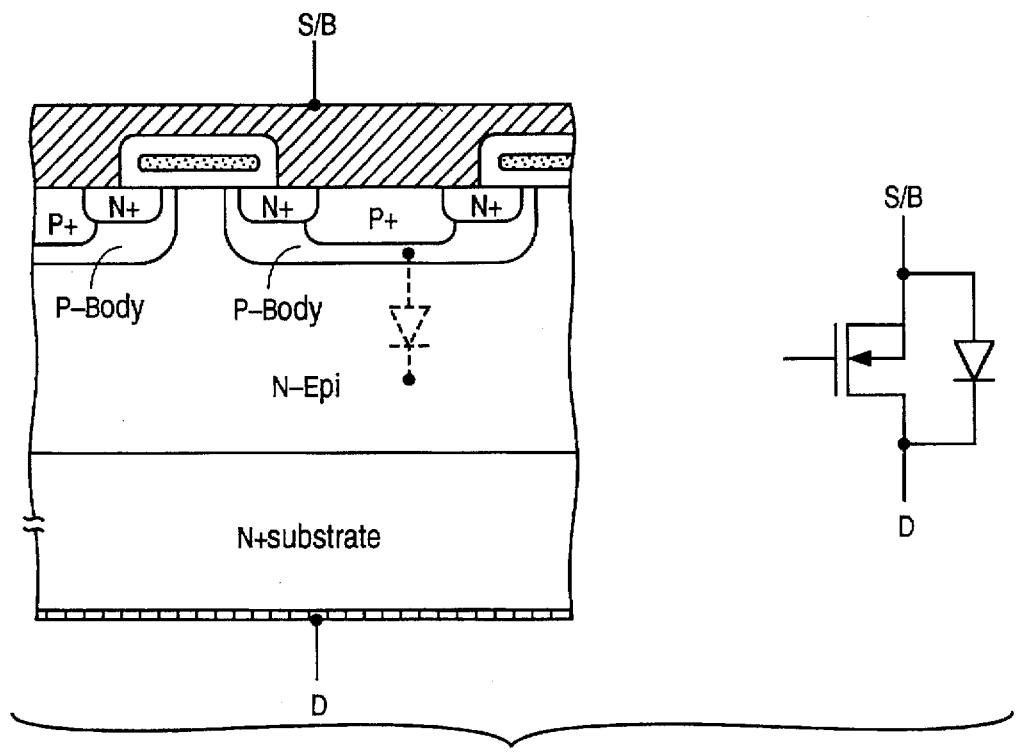
FIGS. 5A–5D illustrate, respectively, a vertical N-channel double-diffused MOSFET, a vertical P-channel double-diffused MOSFET, a lateral N-channel MOSFET, and a lateral N-channel double-diffused MOSFET, all of which contain a source-body short.
Figure 5B:
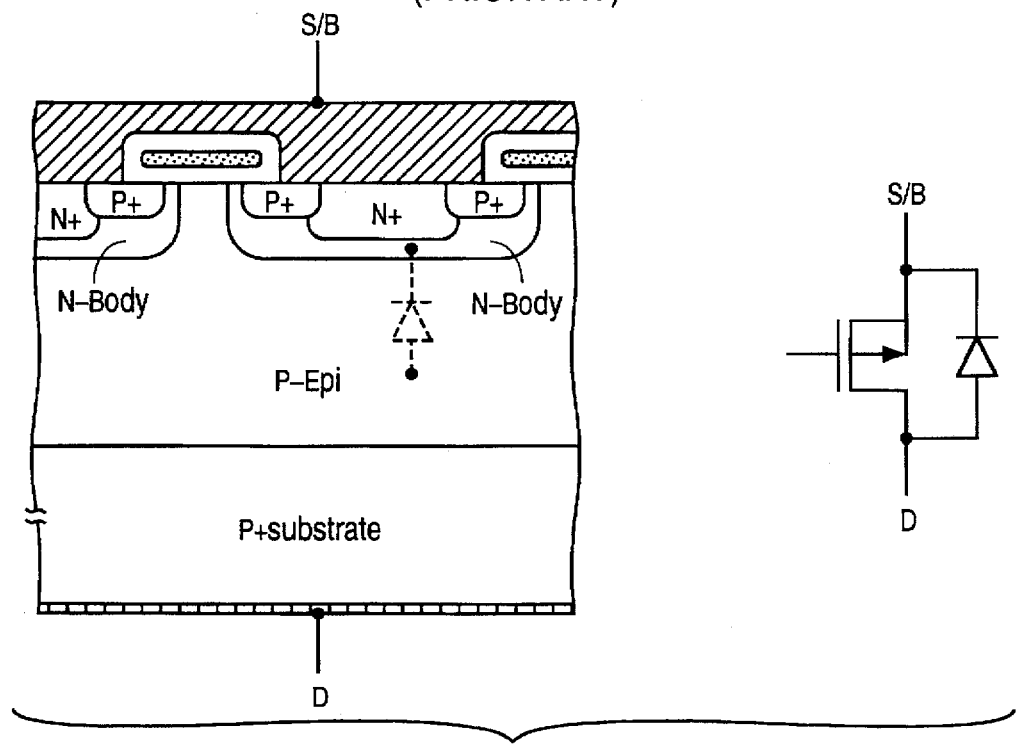
Figure 5C:
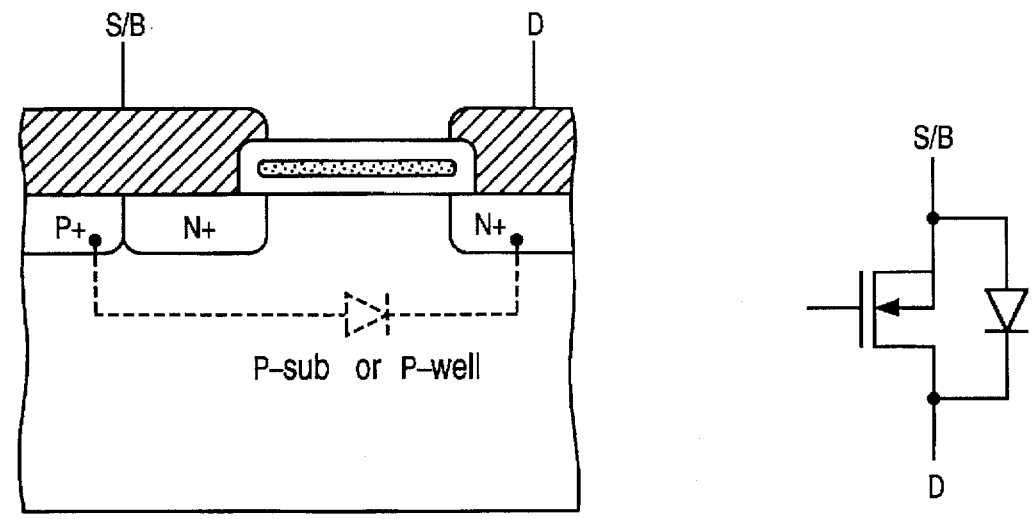
Figure 5D:
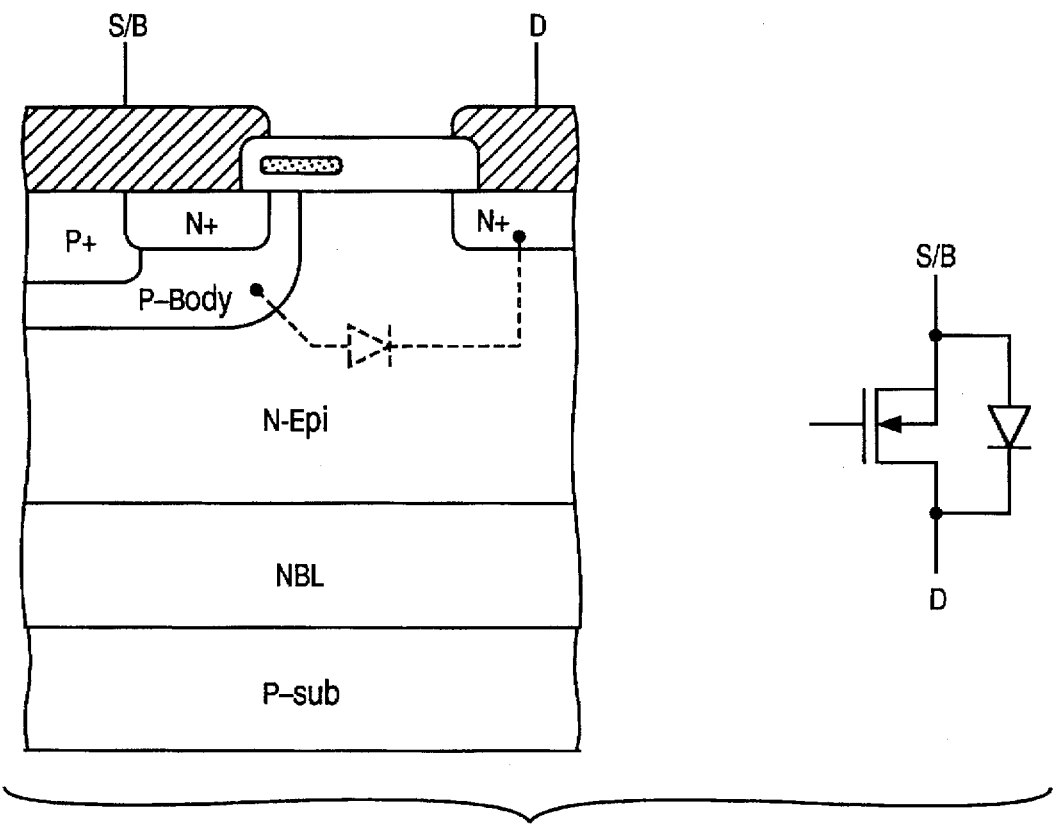
Figure 6A:
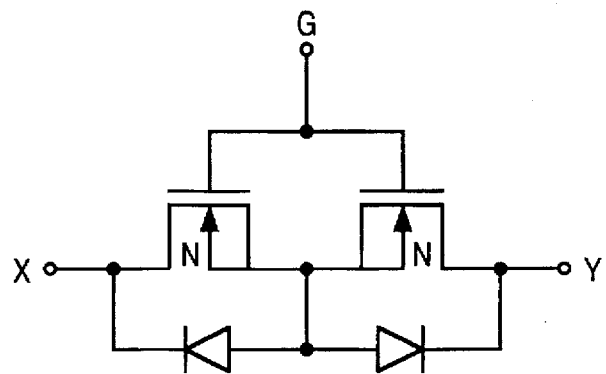
FIGS. 6A-6C illustrate bidirectional current blocking switches consisting of back-to-back MOSFETs.
Figure 6B:
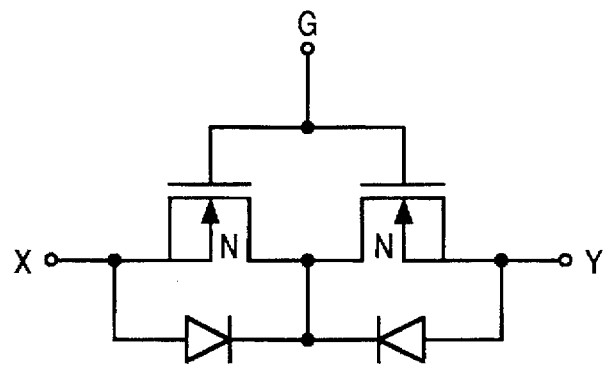
Figure 6C:
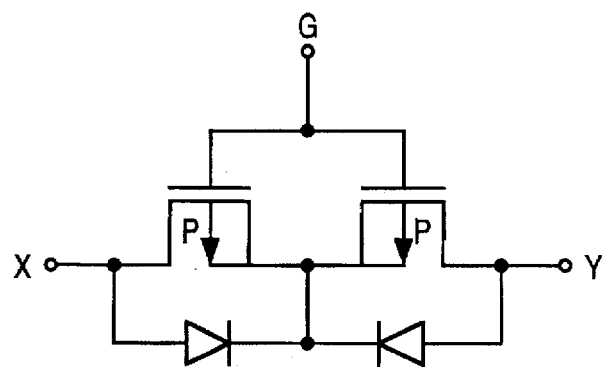
Figure 7:
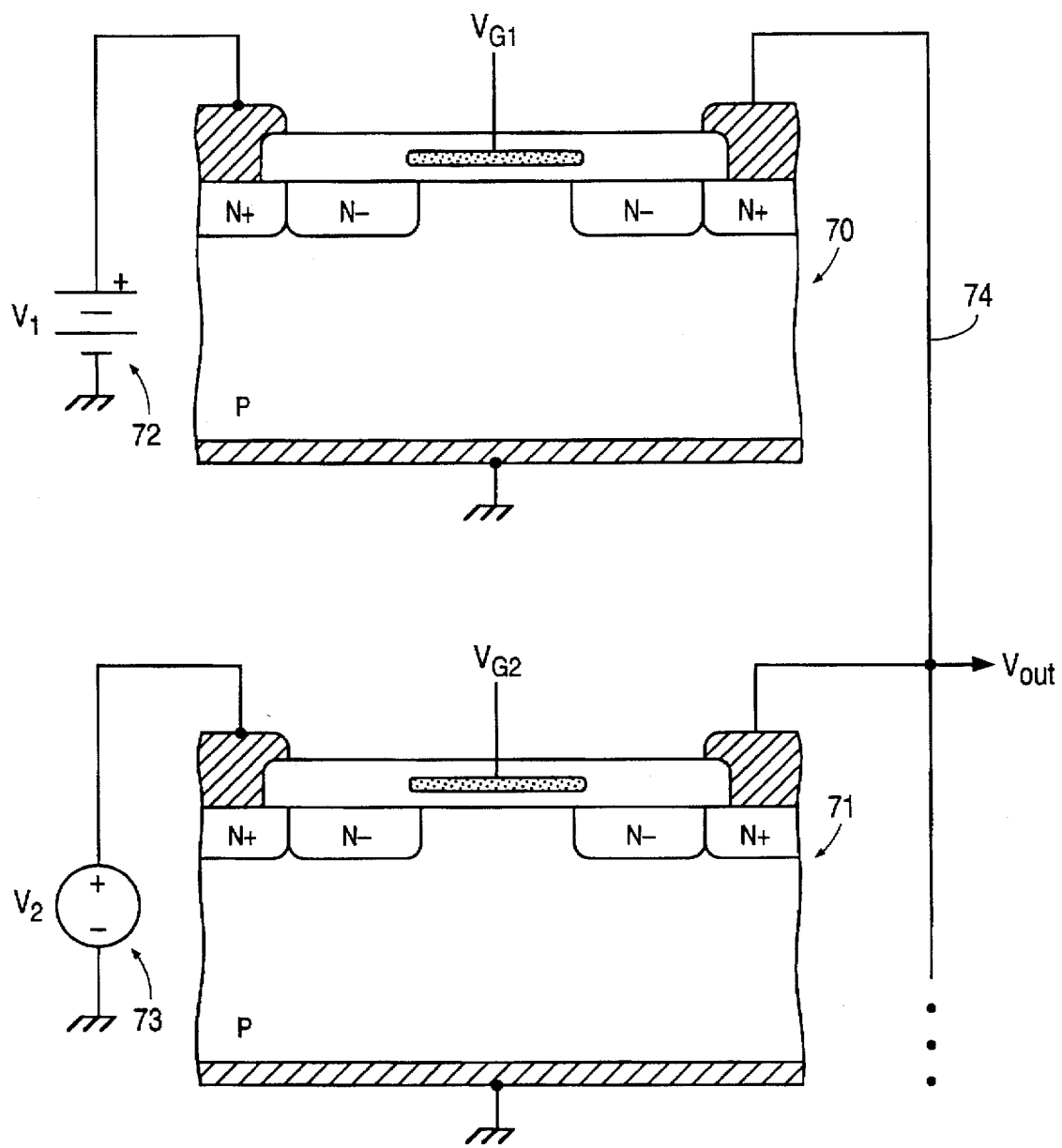
FIG. 7 illustrates a multiple battery power supply arrangement containing bidirectional blocking MOSFET switches in accordance with the invention.
Figure 8:
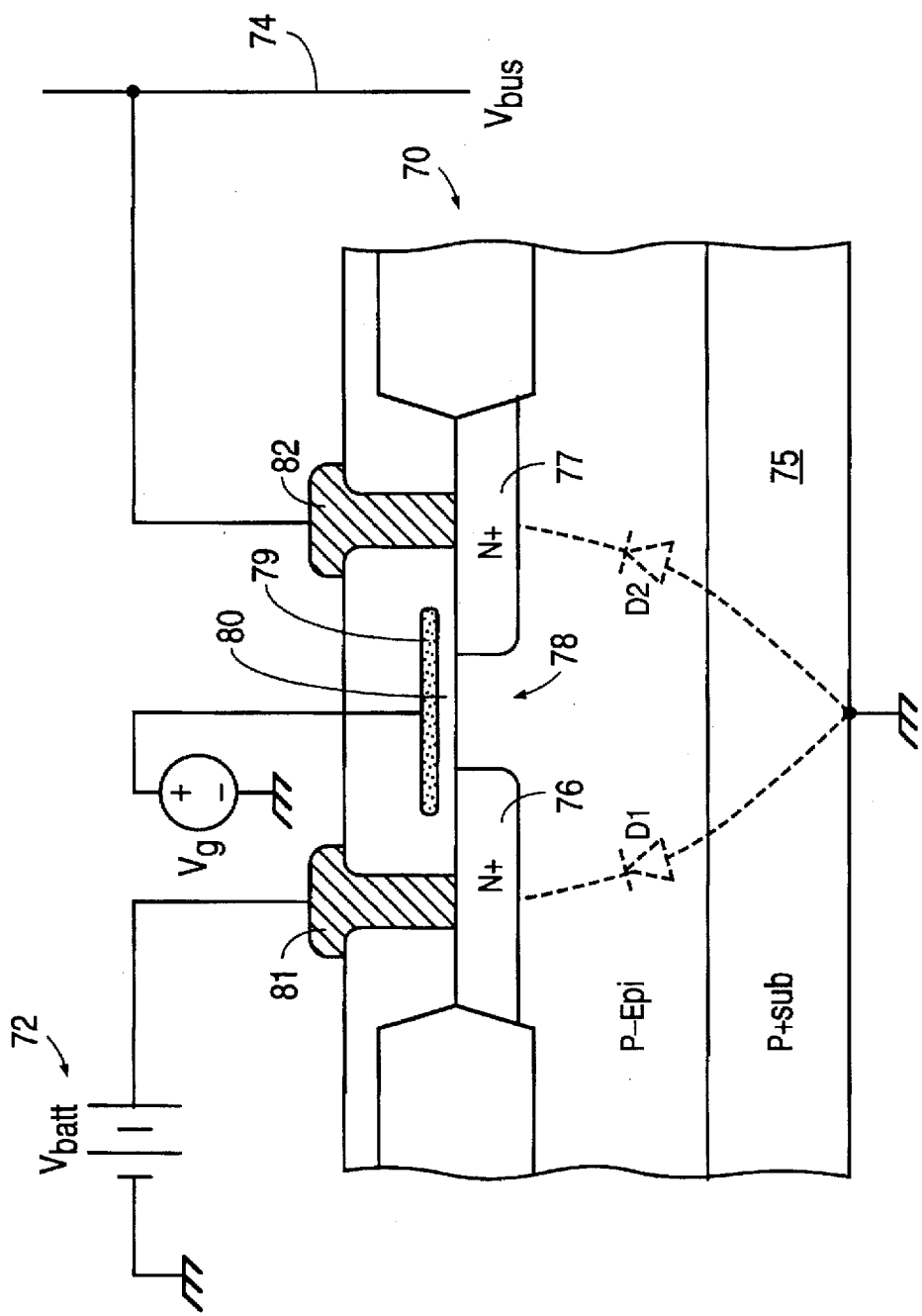
FIG. 8 illustrates a non-drifted bidirectional blocking MOSFET.
Figure 9:
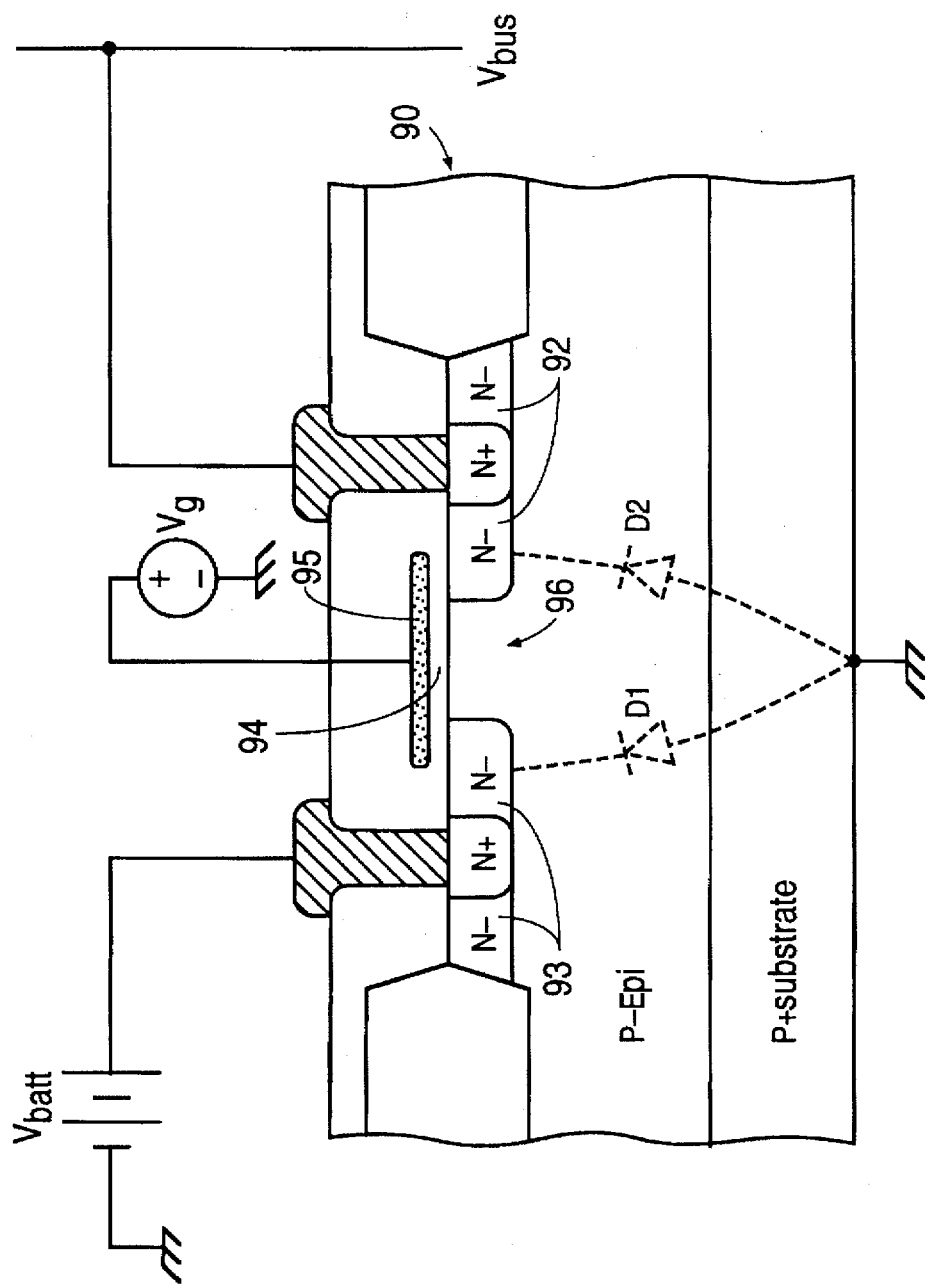
FIG. 9 illustrates a drifted bidirectional blocking MOSFET.

FIGS. 7-9 illustrate bidirectional blocking MOSFET switches associated with the gate drive circuit of the present invention. A brief description of the bidirectional blocking MOSFETs is herein provided for reference. Additional detail regarding the structure and operation of the bidirectional blocking MOSFETs is provided in copending U.S. application Ser. No. 08/159,900, now U.S. Pat. No. 5,536,977, issued Jul. 16, 1996, which is incorporated herein in its entirety.

FIG. 7 shows a multiple source power supply arrangement illustrating a typical use for bidirectional current blocking MOSFET switches. Switch 70 is connected to a battery 72, which supplies a voltage $V_1$, and switch 71 is connected to an AC/DC converter 73 which supplies a voltage $V_2$. While two power sources and two switches are illustrated in FIG. 7, it will be apparent that any number of batteries or other power sources could be included in the arrangement. Switches 70 and 71 connect into a bus 74, which supplies an output voltage $V_{out}$ to a load (not shown).

FIG. 8 illustrates the bidirectional current blocking MOSFET switch 70 of FIG. 7 in greater detail. Switch 70 is a lateral MOSFET which is illustrated in cross section. Switch 70 is preferably formed in either a stripe or cellular pattern in a substrate 75, which in this embodiment is shown as including P-type semiconductor material. N+ regions 76 and 77 are formed at the surface of P substrate 75, separated by a channel region 78. In the description below, the regions 76 and 77 are arbitrarily referred to as source and drain regions, although neither region 76 nor region 77 is technically a source or a drain because the most positive voltage cannot be determined except during operation. A gate 79 is formed over channel region 78, separated from channel region 78 by an oxide layer 80. It will be noted that switch 70 is a symmetrical device, and regions 76 and 77 are not referred to as source or drain regions, since either of them can be biased positively or negatively. A terminal 81 connects N+ region 76 to battery 72 and a terminal 82 connects N+ region 77 to bus 74. Gate 79 is supplied by a gate voltage $V_g$ from a gate drive circuit according to the present invention, which is described below. Finally, the junction between the grounded P substrate 75 and N+ region 76 is represented by a diode $D_1$ and the junction between the grounded P substrate 75 and N+ region 77 is represented by a diode $D_2$.

FIG. 9 illustrates a drifted bidirectional current blocking switch 90, which can be used in place of the non-drifted switch 70 of FIG. 8 in high voltage (greater than about 14 V) applications. A switch 90 contains N-drift regions 92 and 93, which, in the off-state, serve to limit the strength of the electric field between the gate 95 and the diffused N+ source/drain regions and to improve the junction breakdown voltage across oxide region 94. Since the gate must be biased sufficiently positive relative to ground to allow the device to conduct over the specified operating range, the oxide layer 94 separating the gate 95 from the channel region 96 must be thick enough to accommodate the maximum gate voltage reliably. Since either side of switch 90 may serve as the "drain" in a given situation, a drift region must be provided on both sides of the channel region.

Each of the drifted and non-drifted bidirectional blocking MOSFETS 70 and 90, discussed above, is symmetrical; that is, neither the drain nor the source is grounded to the body. The undrifted device 70 is in general useful only up to about 14 volts because higher voltages subject the gate oxide 80 to high fields and may result in avalanche breakdown under the gate 79. The drifted device 90 may be used up to 18 and possibly to 26 volts (or even higher) depending on its design.

Design Optimization of Gate Drive Circuits for Bidirectional MOSFETS

Figure 10B:
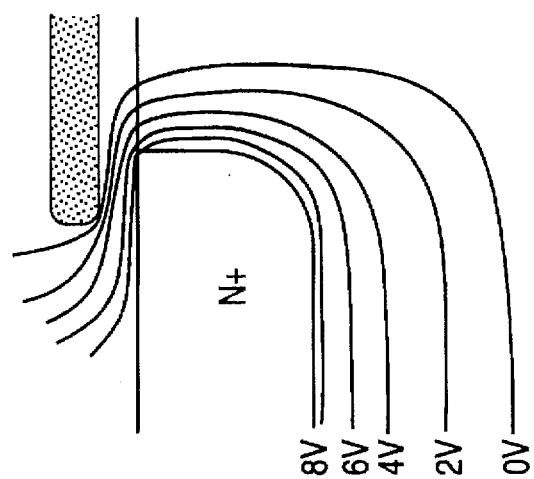
FIGS. 10A and 10B illustrate a non-drifted bidirectional blocking MOSFET in an off condition.
Figure 10A:
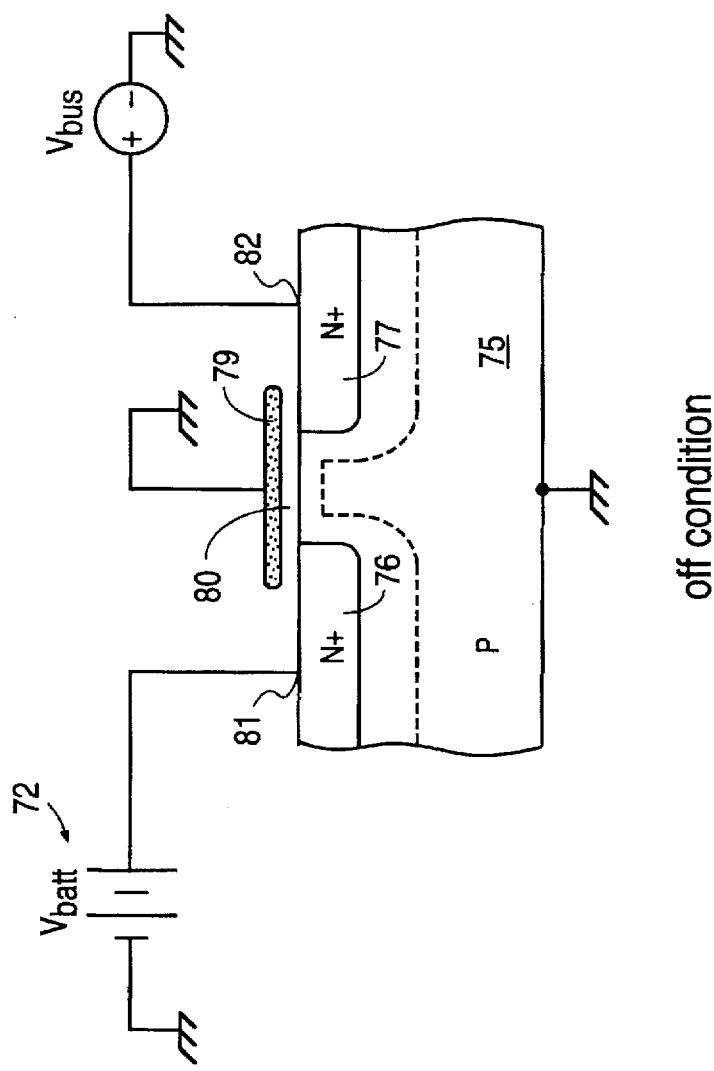

FIGS. 10A and 10B illustrate a fundamental restriction of the above-described non-drifted device 70. As indicated in FIG. 10A, in the off-state, the gate 79 and body 75 are both grounded. The terminal 81 which is connected to the battery 72, is biased at some voltage $V_{batt}$. The other terminal 82 is biased to $V_{bus}$. As indicated in FIG. 10B, since the gate 79 overlaps the heavily-doped regions 76 and 77, virtually the entire applied bias (the difference between $V_{bus}$ and $V_{bat}$) must be supported across the gate oxide layer 80 during the off condition. For an 8V bias using a 50% derating, the thickness of the oxide layer 80 must exceed 160 Å to guarantee a 16V oxide rupture voltage.

It is commonly known that the thickness of the gate oxide layer needed to assure proper operation of a MOSFET depends on three variables:

1. The MOSFET's threshold voltage (gate-to-drain voltage), which is typically in the range of 0.7 to 2.5 volts;

2. The degree of overdrive beyond the threshold voltage which is necessary to achieve a desired minimum on-resistance, which is typically 4 to 10 volts above threshold voltage; and 3. Whether the gate drive circuit provides a gate drive voltage fixed relative to ground, or a gate drive voltage which floats with the source voltage (i.e., the voltage on the least positively biased diffused region).

Figure 11C:
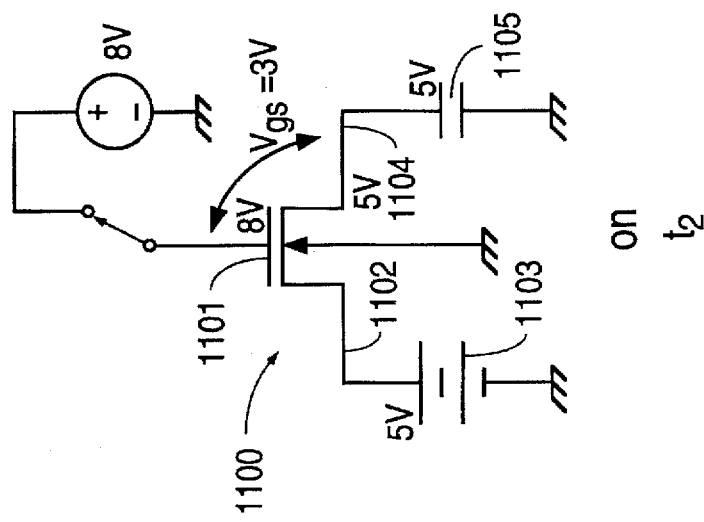
Figure 11B:
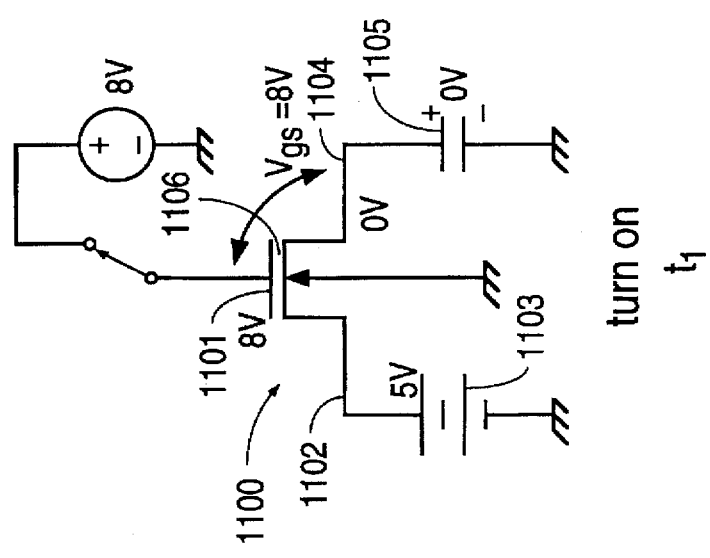
Figure 11A:
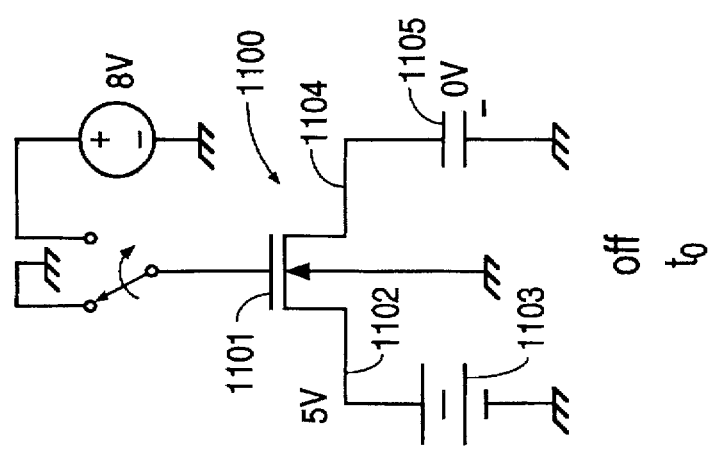

FIGS. 11A–11C illustrate the effect of a fixed 8V gate drive voltage on a non-drifted bidirectional blocking MOSFET driven by a 5V battery 1103. As shown in FIG. 11A, in an off condition, the gate 1101 is connected to ground, the drain 1102 is connected to the 5 volt battery 1103, and the source 1104 is connected to a load 1105, which is represented as a capacitor. As shown in FIG. 11B, at a time $t_1$ of turn-on, a gate drive voltage of 8V is applied to the gate 1101, and the gate-to-source voltage $V_{gs}$ across the gate oxide 1106 becomes 8V. This produces current flow from the drain 1102 to the source 1104 with low resistance due to the high $V_{gs}$. As shown in FIG. 11C, at a time $t_2$ after turn-on, the load voltage reaches 5V, thereby reducing the gate to source voltage $V_{gs}$ to 3V, which in turn increases the on-resistance of the MOSFET 1100. In other words, by limiting the gate drive voltage to the system power supply and referencing it to ground, the gate-to-source voltage $V_{gs}$ decreases as the load voltage increases, thereby increasing the on-resistance of the MOSFET 1100 during a turn-on transition.

Figure 12B:
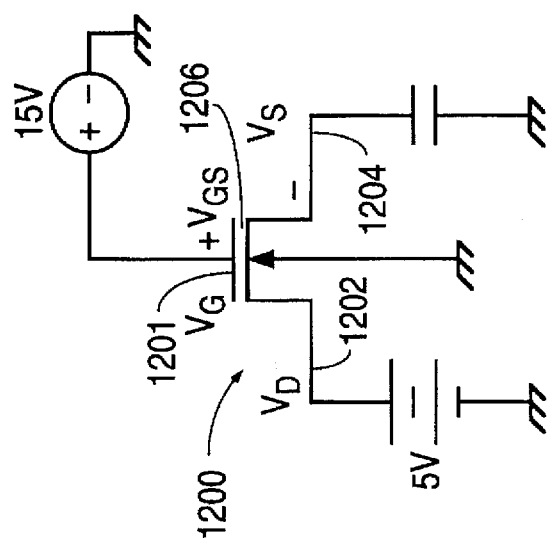
FIGS. 12A and 12B illustrate the gate-to-source and source voltage of a bidirectional blocking MOSFET when a fixed gate voltage is applied.
Figure 12A:
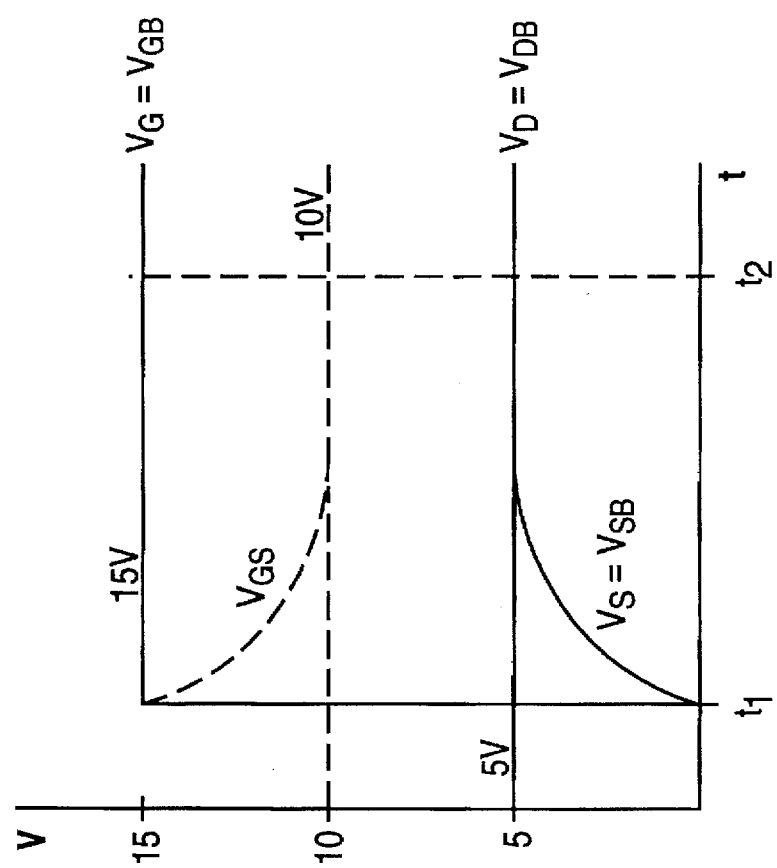

FIGS. 12A and 12B illustrate one method for reducing the on-resistance of a non-drifted bidirectional blocking MOSFET 1200. As indicated in FIG. 12A, if a fixed gate voltage $V_g$ of 15V is applied to the gate 1201 of the MOSFET 1200, a 10V gate-to-source voltage $V_{gs}$ is eventually generated at a time $t_2$ after turn-on. Because of the higher potential, a minimal on-resistance is created between the source 1204 and the drain 1202. However, because a fixed $V_g$ is used, a $V_{gs}$ potential of 15V is present across the gate oxide layer 1206 separating the gate 1201 and the source 1204 at the moment of turn-on $t_1$. That is, the entire 15V is necessarily supported across the gate oxide layer 1206. Using a 50% derating, the 15V $V_{gs}$ value mandates the gate oxide layer 1206 to be over 300 Å.

Figure 13B:
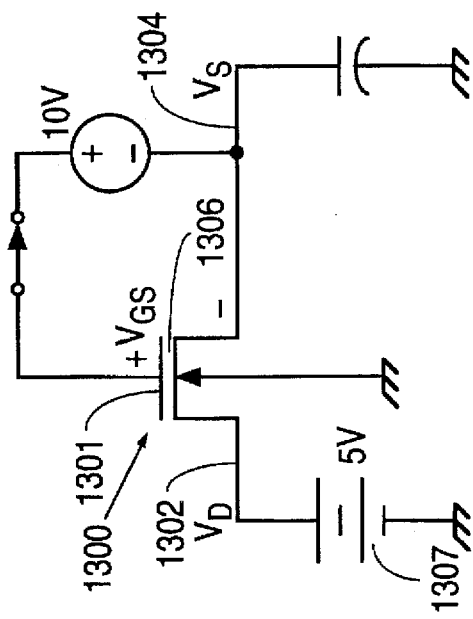
FIGS. 13A and 13B illustrate the gate-to-source and source voltages of a bidirectional blocking MOSFET when a floating gate voltage is applied.
Figure 13A:
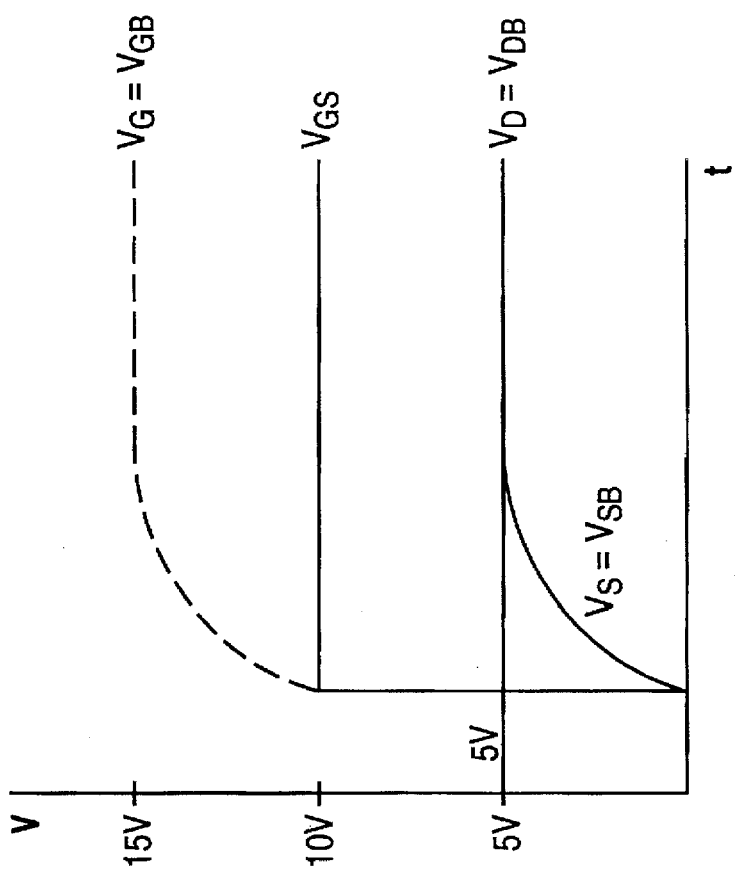

FIGS. 13A and 13B illustrate another method for improving the on-resistance of a non-drifted bidirectional blocking MOSFET 1300 in which the gate voltage $V_g$ is referenced to the source 1304 and floats with the load voltage. In such a case, $V_{gs}$ remains 10 volts at all times, thereby eliminating the need for a gate oxide layer 1306 which is capable of supporting a higher voltage. The gate-to-ground reference value of the gate voltage $V_g$ for the floating gate drive circuit can be expressed as the source voltage $V_s$ plus 10 volts.

Note that the gate oxide layer 1306 never supports more than 10 volts because the formation of the inversion layer shields the gate oxide layer 1306 from the substrate potential. Therefore, if one region 1302 or 1304 is always more positive during conduction, then the gate driver circuit can be permanently referenced to the more negative source side. The combination of such a gate drive circuit with the MOSFET 1300 would produce a bidirectionally-blocking, unidirectionally-conducting MOSFET; that is, current through the MOSFET 1300 can only be safely supported from region 1302 to region 1304. If the more positive of the regions 1302 and 1304 were referenced, then at the moment of turn-on the gate oxide layer 1306 would have to support both the source voltage and the 10 volt gate drive. However, in most cascaded battery applications, discussed above, the more positive region and more negative region are not known, that is, either region 1302 or 1304 may be the more negative region when conduction is desired depending on whether the battery 1307 is discharged or newly charged compared to the bus voltage. Therefore, in order to produce a useful floating gate drive voltage $V_g$ for the bidirectional blocking MOSFET 1300, it is necessary to reference the gate drive voltage $V_g$ to 10 volts above the most negative region 1302 or 1304. When this is accomplished, the combination of such a gate drive circuit with the MOSFET 1300 produces a bidirectionally-blocking, bidirectionally-conducting MOSFET; that is, current through the MOSFET can be in either direction between regions 1302 and 1304. A gate drive circuit which produces a floating gate drive voltage $V_g$ which is 10 volts above the lower region 1302 or 1304 will be disclosed below.

In summary, a non-drifted bilateral blocking MOSFET may be driven by a fixed voltage by increasing the thickness of its gate oxide layer, or may be driven with a floating gate drive voltage which is referenced to the most negative of the source and drain regions.

The use of a fixed gate drive voltage to drive a drifted bidirectional blocking MOSFET presents a problem not associated with the non-drifted MOSFET because the thickness of the gate oxide layer in the drifted MOSFET must be too thick to maintain a low body effect. Body effect is the influence of a reverse-biased source-to-body junction resulting in an increase in threshold voltage $V_1$ and a commensurate decrease in gate drive $V_{gs}$–$V_1$, thereby leading to an increase in on-resistance $R_{ds}$. As discussed above, for a MOSFET to achieve a low on-resistance, the fixed gate drive voltage must be 10 volts above the source voltage so that, when the drain voltage and source voltage are equivalent, the gate-to-drain voltage is 10 volts. However, because drifted bidirectional blocking MOSFETs are typically incorporated into systems driven by an 18 volt (or higher) battery, and because the gate drive circuit must produce 10 volts above the system voltage, the gate drive circuit must produce nearly 30 volts. To assure safe operation and to prevent breakdown, the thickness of the gate oxide layer must be over 700 Å in order to support a 60 volt gate-to-drain voltage (using a 50% derating). Like the non-drifted bidirectional blocking MOSFET, the worst case electric fields appear across the gate at turn-on. After the device turns on the inversion layer shields the gate oxide from the substrate potential.

It is interesting to note that the maximum voltage of a symmetric drifted bidirectional MOSFET is not limited by the off-state condition since the drift regions drop most of the gate-to-drain voltage. Instead the turn-on and on states are most critical in this voltage range.

Gate Drive Circuits

Gate drive circuits according to the present invention will now be discussed with reference to FIGS. 14–17.

Figure 14:
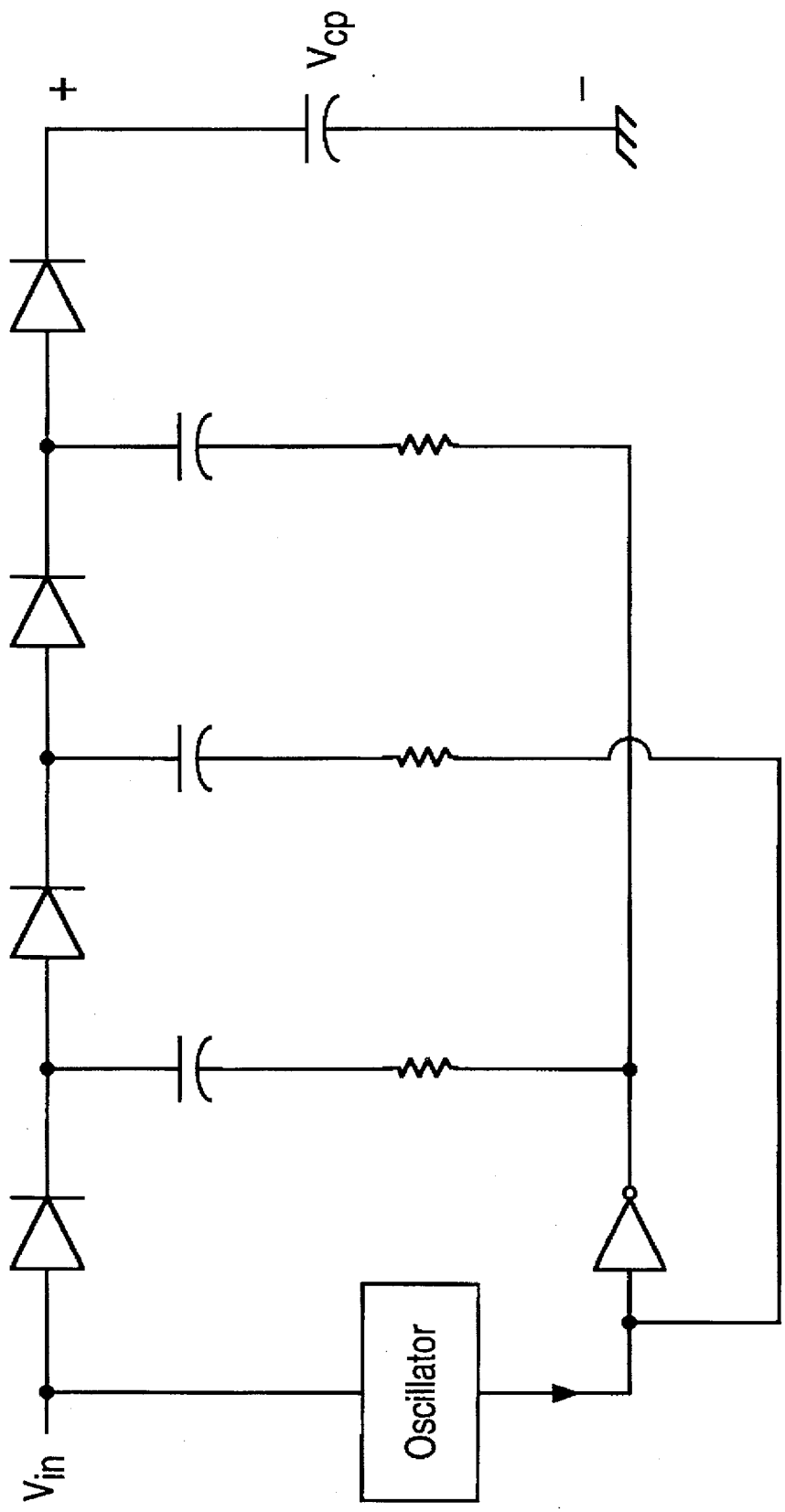
FIG. 14 illustrates a charge pump circuit used in the gate drive circuit of the present invention.

In each situation discussed above regarding fixed and floating gate drive voltages, the gate drive voltage for the disclosed drifted or non-drifted n-channel bidirectional blocking MOSFET must be capable of exceeding the maximum applied to either terminal region by at least 10 volts to achieve minimal on-resistance. The only economically practical way to provide this voltage is with a charge pump. A charge pump is a well known device used to produce an output voltage $V_{cp}$ which is higher than its input voltage $V_{in}$. FIG. 14 illustrates one charge pump circuit for reference. Additional discussion regarding charge pumps is provided in co-owned U.S. application Ser. No. 08/067,365, filed May 26, 1993 now U.S. Pat. No. 5,539,610, issued on Jul. 23, 1996, which is incorporated herein in its entirety.

Figure 15:
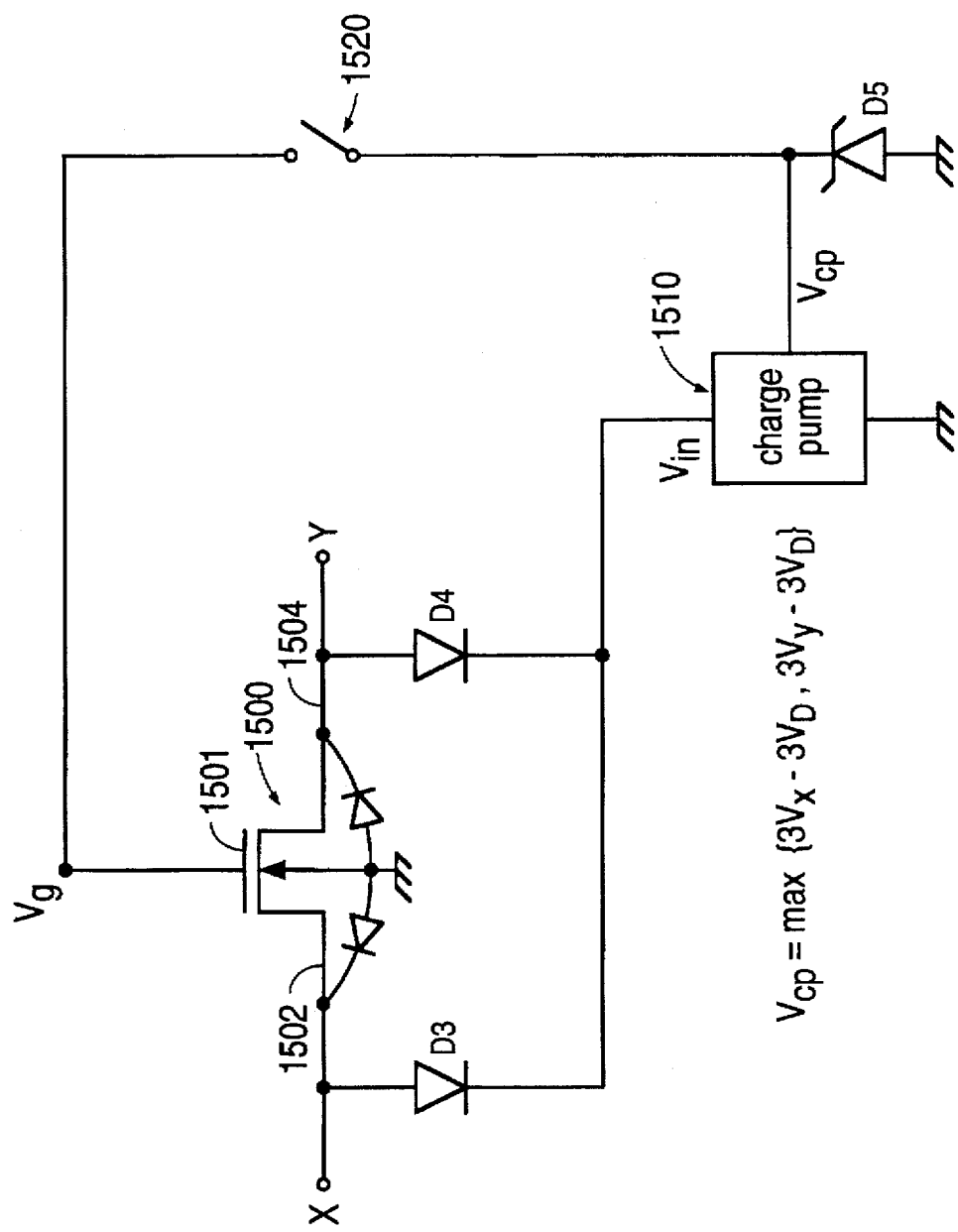
FIG. 15 illustrates a first embodiment of the gate drive circuit in accordance with the present invention.

FIG. 15 illustrates a first embodiment of the present invention in which a fixed gate drive voltage is generated for a bidirectional blocking MOSFET 1500. The gate drive circuit includes a charge pump 1510 having an input terminal connected to both the source region 1502 and drain region 1504 of the MOSFET 1500. A first diode D3 is connected between the region 1502 and the charge pump 1510 such that its anode is connected to the region 1502 and its cathode is connected to the input terminal of the charge pump 1510. Similarly, a second diode D4 is connected between the region 1504 and the charge pump 1510 such that its anode is connected to the region 1504 and its cathode is connected to the input terminal of the charge pump 1510. The output voltage $V_{cp}$ of the charge pump 1510 is connected to a gate 1501 of the MOSFET 1500. Further, a grounded zener diode D5, having a selected breakdown voltage $BV_z$, is connected at its cathode to $V_{cp}$. Finally, a switch 1520 connected between the gate 1501 and the charge pump 1510.

In the gate drive circuit shown in FIG. 15, the input voltage $V_{in}$ of the charge pump 1510 is equal to the voltage on the more positive region 1502 or 1504, minus a diode drop associated with diodes D3 and D4. Note that only the more positive region 1502 or 1504 will forward bias its associated diode D3 or D4; the more negative region 1502 or 1504 will not affect $V_{in}$. For a charge pump circuit similar to that shown in FIG. 14, $V_{cp}$ is typically three times $V_{in}$ minus 2.1 volts. Assuming a 0.7 volt diode drop and a maximum voltage of 10 volts on the regions 1502 and 1504, $V_{cp}$ for the charge pump 1510 would be approximately 25 volts above ground. After the bidirectional MOSFET 1500 is on and the source voltage rises to the drain voltage, $V_{gs}$ becomes 15 volts (25 volts minus 10 volts). Beyond a selected zener breakdown voltage $BV_z$, for example 27 volts, the zener diode D5 avalanches and clamps the maximum voltage applied to the gate 1501.

The gate drive circuit in accordance with the first embodiment, described above, generates a gate drive voltage $V_g$ which is fixed relative to ground, and is therefore limited to the above-mentioned limitations associated with fixed voltage gate drive circuits.

While the diodes D3 and D4 can be eliminated and the charge pump 1510 powered from a separate supply voltage, the above-disclosed method offers the advantage that the absolute output voltage of the charge pump 1510 (relative to ground) increases in proportion to the MOSFET's higher terminal voltage (as long as it is below the zener clamping voltage). For increasing terminal voltages on the MOSFET 1500, the increased gate drive compensates the increased body effect at higher voltages, thereby keeping the on-resistance $R_{ds}$ low. If the charge pump 1510 were powered by a fixed input the gate drive may be 13.2 volts, which is inadequate for the full operational range of the MOSFET 1500.

Figure 16A:
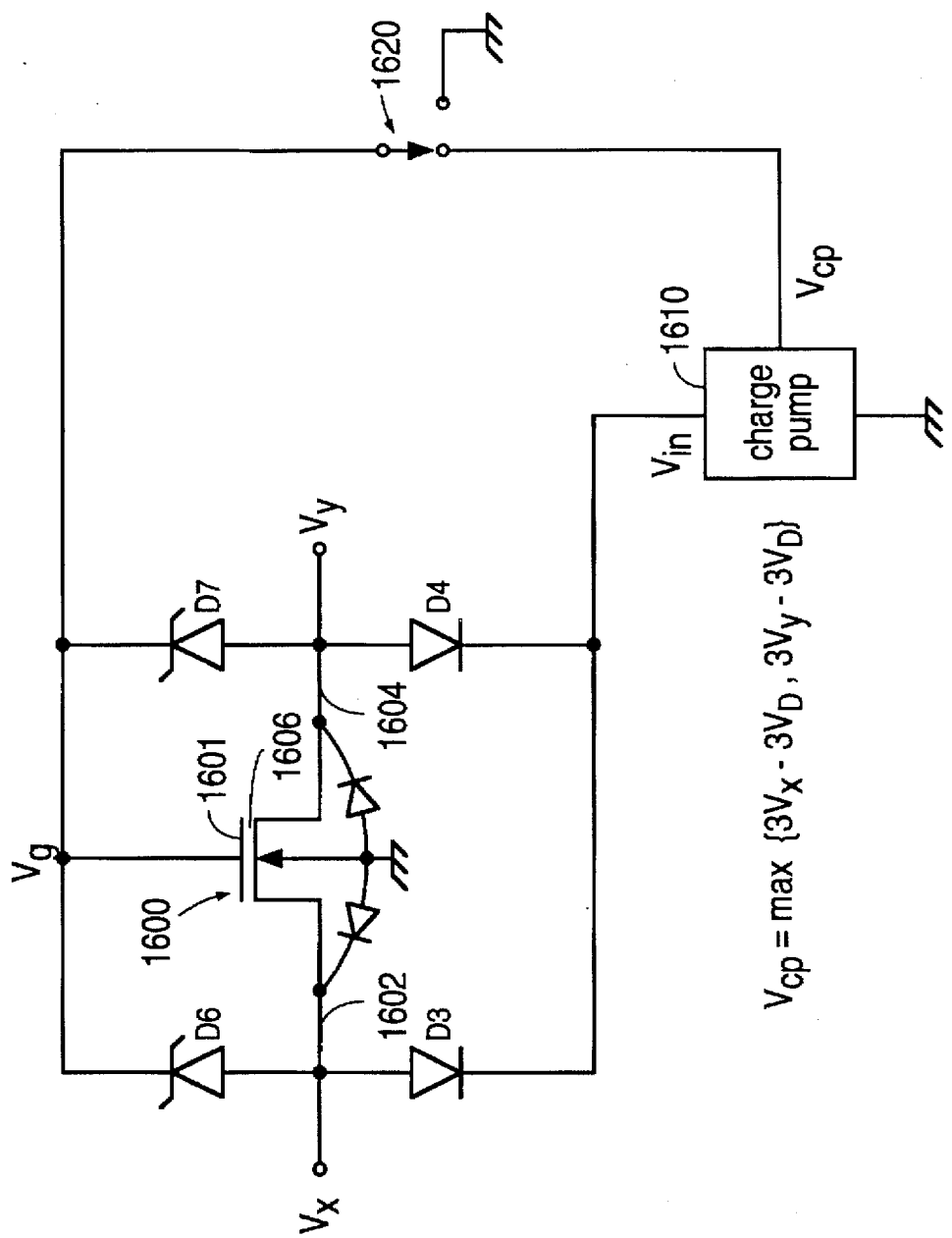
FIG. 16A illustrates a second embodiment of the gate drive circuit in accordance with the present invention.
Figure 16B:
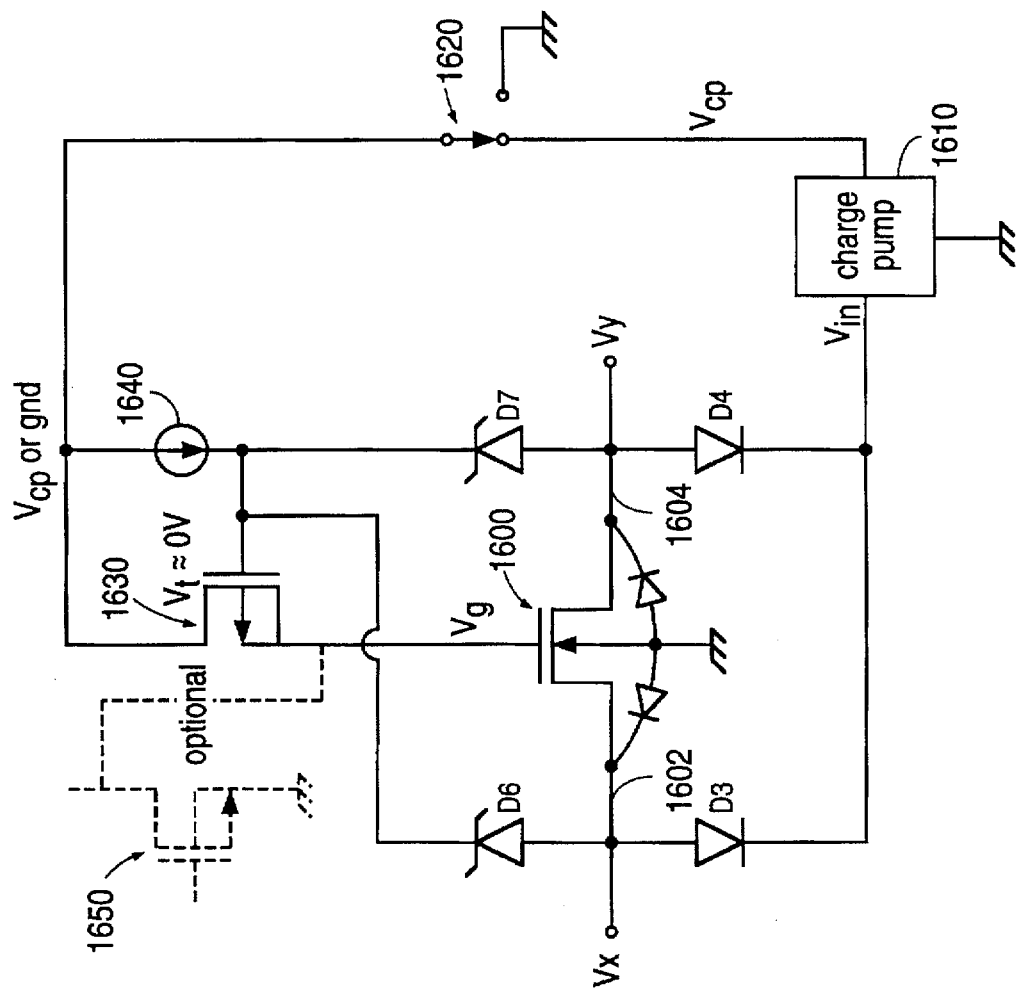
FIG. 16B illustrates a third embodiment of the gate drive circuit in accordance with the present invention.

FIGS. 16A and 16B illustrate second and third embodiments of the present invention. Elements which are common to both the second and third embodiments are identified with the same reference numerals.

FIG. 16A illustrates a gate drive circuit in accordance with a second embodiment of the present invention in which a floating gate drive voltage $V_g$ is applied to a gate 1601 of a bidirectional blocking MOSFET 1600. As in the first embodiment, the gate drive circuit according to the second embodiment of the present invention includes a charge pump 1610 having an input terminal connected to both the source region 1602 and drain region 1604 of the MOSFET 1600. A first diode D3 is connected between the region 1602 and the charge pump 1610 such that its anode is connected to the region 1602 and its cathode is connected to the input terminal of the charge pump 1610. Similarly, a second diode D4 is connected between the region 1604 and the charge pump 1610 such that its anode is connected to the region 1604 and its cathode is connected to the input terminal of the charge pump 1610. With this arrangement, the input voltage $V_{in}$ of the charge pump 1610 is equal to the greater of the voltages $V_x$ and $V_y$ of the regions 1602 and 1604, minus a diode drop associated with diodes D3 and D4. The output voltage $V_{cp}$ of the charge pump 1610 is connected to a gate 1601 of the MOSFET 1600. Further, a zener diode D6, having a selected breakdown voltage, is connected at its cathode to $V_{cp}$ and at its anode to the region 1602. Similarly, a zener diode D7, having a breakdown voltage equal to the breakdown voltage of zener diode D6, is connected at its cathode to $V_{cp}$ and at its anode to the region 1604. Finally, a switch 1620 connected between the gate 1601 and the charge pump 1610.

In the gate drive circuit shown in FIG. 16A, the gate drive voltage $V_g$ floats at a level equal to the more negative region 1602 or 1604, plus a diode drop associated with zener diodes D6 and D7. That is, the charge pump output voltage $V_{cp}$ is reduced by the presence of the zener diodes D6 such that the gate drive voltage $V_g$ applied to the gate 1601 is clamped at a breakdown voltage associated with the zener diodes D6 and D7 above the voltage on the most negative of the regions 1602 and 1604. A benefit of the gate drive circuit according to the second embodiment is that the gate oxide layer 1606 can be made substantially thinner than the gate oxide layer of the above-described first embodiment because the gate-to-source voltage of the second embodiment is limited to the breakdown voltage of the zener diodes D6 and D7. However, one disadvantage of the gate drive circuit of the second embodiment is that it can waste battery power because the zener diodes D6 and D7 draw current in the breakdown condition.

FIG. 16B illustrates a gate drive circuit in accordance with a third embodiment of the present invention. As in the second embodiment, the gate drive, circuit according to the third embodiment includes a charge pump 1610 having an output terminal connected to both the source region 1602 and drain region 1604 of the MOSFET 1600 through zener diodes D6 and D7. However, in accordance with the third embodiment, a P-channel MOSFET 1630 is connected between the charge pump 1610 and the gate of the bidirectional MOSFET 1600, and the gate of the P-channel MOSFET 1630 is connected to the zener diodes D6 and D7 such that the gate drive voltage of the P-channel MOSFET 1630 is determined by the voltage of the more negative region 1602 or 1604. In addition, a current source 1640 is connected between the charge pump 1610 and the cathodes of the zener diodes D6 and D7 to reduce the load driven by the charge pump 1610.

In either of the second and third embodiments, an optional N-channel MOSFET 1650, as shown in FIG. 16B, may be used to pull the gate of the bidirectional MOSFET 1600 to ground when the bidirectional MOSFET 1600 is disconnected from the charge pump 1610, such as when the switch 1620 is opened.

Figure 17A:
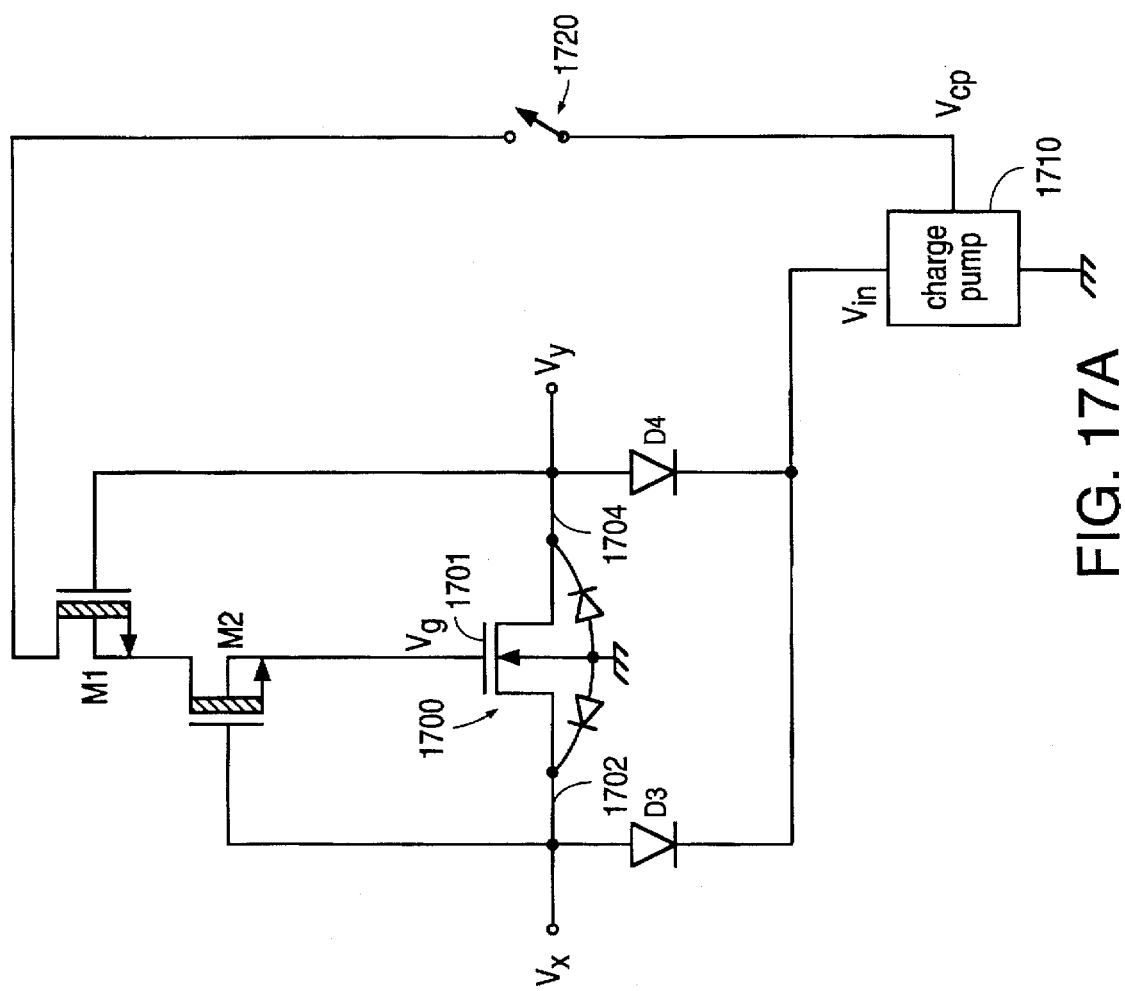
FIG. 17A illustrates a fourth embodiment of the gate drive circuit in accordance with the present invention.
Figure 17B:
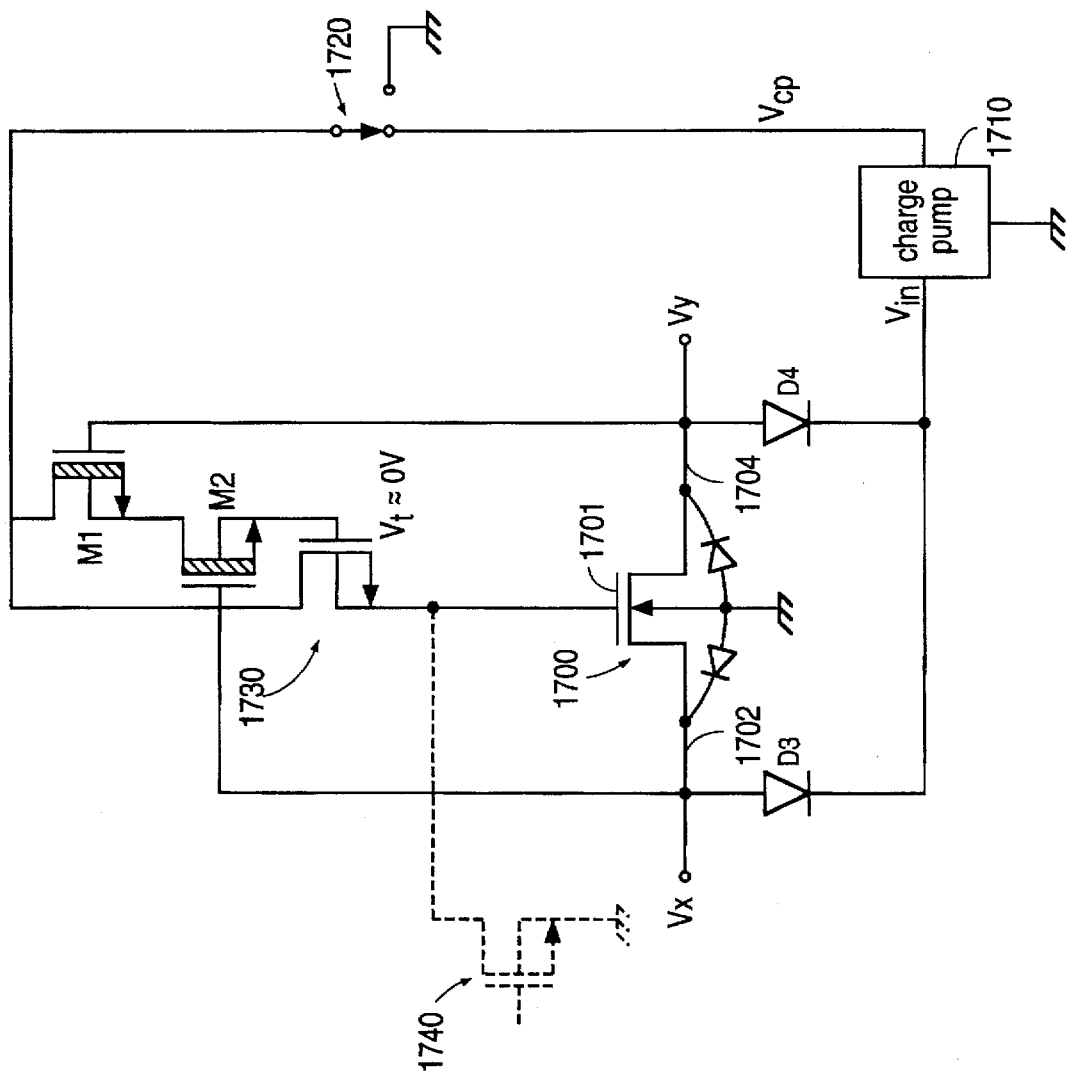
FIG. 17B illustrates a fifth embodiment of the gate drive circuit in accordance with the present invention.

FIGS. 17A and 17B illustrate fourth and fifth embodiments of the present invention. Elements which are common to both the fourth and fifth embodiments are identified with the same reference numerals.

FIG. 17A illustrates a gate drive circuit in accordance with a fourth embodiment of the present invention in which a floating gate drive voltage $V_g$ is applied to a gate 1701 of a bidirectional blocking MOSFET 1700. As in the first through third embodiments, the gate drive circuit according to the fourth embodiment of the present invention includes a charge pump 1710 having an input terminal connected to both the source region 1702 and drain region 1704 of the MOSFET 1700. A first diode D3 is connected between the region 1702 and the charge pump 1710 such that its anode is connected to the region 1702 and its cathode is connected to the input terminal of the charge pump 1710. Similarly, a second diode D4 is connected between the region 1704 and the charge pump 1710 such that its anode is connected to the region 1704 and its cathode is connected to the input terminal of the charge pump 1710. In addition, a pair of depletion mode MOSFETs M1 and M2 are connected in series between the charge pump 1710 and the bidirectional blocking MOSFET 1700 such that the drain of the depletion mode MOSFET M1 is connected to the charge pump 1710, the drain of the depletion mode MOSFET M2 is connected to the source of the MOSFET M1, and the source of the MOSFET M2 is connected to the gate 1701 of the bidirectional MOSFET 1600. Note that the MOSFETs M1 and M2 are "typical" in that they include the traditional source-body short. Further, the gate of the MOSFET M1 is connected to the region 1704 and the gate of the MOSFET M2 is connected to the region 1702. Finally, a switch 1720 connected between the drain of the MOSFET M1 and the charge pump 1710.

The gate drive circuit shown in FIG. 17A is similar to the above-described second and third embodiments in that the gate drive voltage is limited in proportion to the lower switch voltage. By selecting the threshold voltages of the MOSFETs M1 and M2 to be −8V, the MOSFETs M1 and M2 will allow their respective sources to rise to a voltage 8V above their gates before shutting off. By connecting the gates to regions 1702 and 1704, the gate voltage Vg is clamped to a value which is 8V greater than the voltage on the most negative region 1702 and 1704. For example, if the region 1702 is maintained at 20 volts, and the region 1704 is at ground when Vg is first applied, MOSFET M1 will limit Vg to 8 volts. Note that, without MOSFET M1, MOSFET M2 would allow Vg to rise to 8V above 20V, i.e. 28V. The maximum gate voltage is thereby limited by M1 to 8 volts above the lower voltage. As the voltage at region 1704 rises, Vg will track this voltage. When region 1704 is at 10V, Vg is 18 V so that Vgs remains 8 volts.

FIG. 17B illustrates a gate drive circuit in accordance with a fifth embodiment of the present invention. As in the fourth embodiment, the gate drive circuit according to the fifth embodiment includes a pair of depletion mode MOSFETs M1 and M2 connected in series with the charge pump 1710. However, in the fifth embodiment, an N-channel MOSFET 1730 is connected between the charge pump 1710 and the gate of the bidirectional MOSFET 1700, and the gate of the N-channel MOSFET 1730 is connected to the source of the depletion mode MOSFET M2.

In either of the fourth and fifth embodiments, an optional N-channel MOSFET 1740, as shown in FIG. 17B, may be used to pull the gate of the bidirectional MOSFET 1700 to ground when the bidirectional MOSFET 1700 is disconnected from the charge pump 1710, such as when the switch 1720 is opened.

It is noted that the charge pump arrangement taught in the second through fifth embodiments (FIGS. 16A, 16B, 17A and 17B) may receive input voltage $V_{in}$ directly from a power supply, instead of through the diodes D3 and D4.

The foregoing examples are intended to be illustrative and not limiting. Many additional and alternative embodiments according to this invention will be apparent to those skilled in the art. All such embodiments are intended to be covered within the scope of this invention, as defined in the following claims.

I claim:

1. A gate drive circuit for generating a gate drive voltage on a gate of a bidirectional MOSFET, the bidirectional MOSFET including a body, first and second regions of a first conductivity type formed in the body and separated by a channel region of a second conductivity type also formed in the body, the gate being located over the channel and separated from the body by a gate oxide layer, the gate drive circuit comprising:

a voltage generating circuit comprising a charge pump having an input terminal connected to the first region through a first rectifying device, the input terminal also being connected to the second region through a second rectifying device, the voltage generating circuit also having an output terminal connected to the gate of the bidirectional MOSFET for limiting the gate drive voltage to a maximum voltage determined by a thickness of the gate oxide layer.

2. A gate drive circuit for generating a gate drive voltage on a gate of a bidirectional MOSFET, the bidirectional MOSFET including a body, first and second regions of a first conductivity type formed in the body and separated by a channel region of a second conductivity type also formed in the body, the gate being located over the channel and separated from the body by a gate oxide layer, wherein the body is maintained at a predetermined voltage, the gate drive circuit comprising:

a voltage generating circuit comprising a charge pump having an input terminal connected to the first region through a first rectifying device, the input terminal also being connected to the second region through a second rectifying device, the charge pump generating an output voltage which is applied to the gate of the bidirectional MOSFET, the output voltage being generated solely from current received from the first and second rectifying devices, wherein the output voltage from the charge pump produces the gate drive voltage at a level less than or equal to a maximum voltage determined by a thickness of the gate oxide layer.

3. A gate drive circuit of claim 2 wherein:

the first rectifying device comprises a first diode having a first terminal connected to the first region;

the second rectifying device comprises a second diode having a first terminal connected to the second region, wherein the input terminal of the charge pump is connected to a second terminal of each of the first and second diodes; and the gate drive circuit further comprises a grounded zener diode having a first terminal connected to the output voltage for limiting a level of the output voltage to a breakdown voltage of the zener diode.

4. A gate drive circuit of claim 3 further comprising a switch connected between the charge pump and the gate of the bidirectional MOSFET.

5. A gate drive circuit of claim 2 wherein the voltage generating circuit further comprises:

a first zener diode having a first terminal connected to the charge pump and a second terminal connected to the first region; and a second zener diode having a first terminal connected to the charge pump and a second terminal connected to the second region.

6. A gate drive circuit of claim 5:

wherein the first rectifying device comprises a first diode having a first terminal connected to the first region;

wherein the second rectifying device comprises a second diode having a first terminal connected to the second region; and wherein the input terminal of the charge pump is connected to a second terminal of each of the first and second diodes.

7. A gate drive circuit of claim 5 further comprising a single pole, double throw switch and a second MOSFET, a first terminal of the switch being connected to an output of the charge pump, a second terminal of the switch being connected to ground, a common terminal of the switch being connected to a gate of the second MOSFET and through the second MOSFET to the gate of the bidirectional MOSFET, whereby when the switch is thrown so as to disconnect the charge pump from the bidirectional MOSFET, the second MOSFET is turned on to connect the gate of the bidirectional MOSFET to ground.

8. A gate drive circuit of claim 2 wherein the voltage generating circuit further comprises:

a second MOSFET having a first terminal connected to the charge pump and a second terminal connected to the gate of the bidirectional MOSFET;

a first zener diode having a first terminal connected to a gate of the second MOSFET and a second terminal connected to the first region; and a second zener diode having a first terminal connected to the gate of the second MOSFET and a second terminal connected to the second region.

9. A gate drive circuit of claim 8 wherein the voltage generating circuit further comprises a current source connected between the charge pump and the gate of the second MOSFET.

10. A gate drive circuit of claim 8 further comprising a switch connected between the charge pump and the gate of the bidirectional MOSFET, and a third MOSFET connected between the gate of the bidirectional MOSFET and ground, such that when the switch is opened to disconnect the charge pump from the bidirectional MOSFET, the third MOSFET is turned on to connect the gate of the bidirectional MOSFET to ground.

11. A gate drive circuit of claim 2 wherein the voltage generating circuit further comprises:

a first depletion-mode MOSFET having a first terminal connected to the charge pump and a gate connected to the second region; and a second depletion-mode MOSFET having a first terminal connected to a second terminal of the first MOSFET, a gate connected to the first region, and a second terminal connected to the gate of the bidirectional MOSFET.

12. A gate drive circuit of claim 11:

wherein the first rectifying device comprises a first diode having a first terminal connected to the first region;

wherein the second rectifying device comprises a second diode having a first terminal connected to the second region; and wherein the input terminal of the charge pump is connected to a second terminal of each of the first and second diodes.

13. A gate drive circuit of claim 11 further comprising a switch connected between the charge pump and the gate of the bidirectional MOSFET, and a third MOSFET connected between the gate of the bidirectional MOSFET and ground, such that when the switch is opened to disconnect the charge pump from the bidirectional MOSFET, the third MOSFET is turned on to connect the gate of the bidirectional MOSFET to ground.

14. A gate drive circuit of claim 2 wherein the voltage generating circuit further comprises:

a first depletion-mode MOSFET having a first terminal connected to the charge pump and a gate connected to the second region;

a second depletion-mode MOSFET having a first terminal connected to a second terminal of the first depletion-mode MOSFET, a gate connected to the first region; and a third MOSFET having a first terminal connected to the charge pump and a second terminal connected to the gate of the bidirectional MOSFET, the third MOSFET also having a gate connected to a second terminal of the second depletion-mode MOSFET.

15. A gate drive circuit of claim 14:

wherein the first rectifying device comprises a first diode having a first terminal connected to the first region;

wherein the second rectifying device comprises a second diode having a first terminal connected to the second region; and wherein the input terminal of the charge pump is connected to a second terminal of each of the first and second diodes.

16. A gate drive circuit of claim 15 further comprising a switch connected between the charge pump and the gate of the bidirectional MOSFET, and a fourth MOSFET connected between the gate of the bidirectional MOSFET and ground, such that when the switch is opened to disconnect the charge pump from the bidirectional MOSFET, the fourth MOSFET is turned on to connect the gate of the bidirectional MOSFET to ground.

17. A method for generating a gate drive voltage on a gate of a bidirectional MOSFET, the bidirectional MOSFET including a body, first and second regions of a first conductivity type formed in the body and separated by a channel region of a second conductivity type also formed in the body, the gate being located over the channel and separated from the body by a gate oxide layer, wherein the body is maintained at a predetermined voltage potential, the method comprising:

connecting the first region and the second region to an input terminal of a voltage generating circuit, wherein the voltage generating circuit includes a charge pump, through first and second rectifying devices such that the first region is connected to the input terminal through a first rectifying device, and the second region is connected to the input terminal through a second rectifying device;

connecting the gate of the bidirectional MOSFET to an output terminal of the charge pump, wherein the charge pump generates an output voltage which produces the gate drive voltage at the gate of the bidirectional MOSFET, the output voltage being generated solely from current received from the first and second rectifying devices; and limiting the gate drive voltage to a level less than or equal to a maximum voltage determined by a thickness of the gate oxide layer.

18. A method of claim 17:

wherein the first rectifying device is a first diode having a first terminal connected to the first region and a second terminal connected to the input terminal of the charge pump, the second rectifying device is a second diode having an first terminal connected to the second region and a second terminal connected to the input terminal of the charge pump; and wherein the step of limiting comprises connecting a first terminal of a grounded zener diode to the output voltage of the charge pump such that a level of the output voltage does not exceed a breakdown voltage of the zener diode.

19. A method of claim 17 wherein the step of connecting the gate of the bidirectional MOSFET further comprises:

connecting a first terminal of a first zener diode to the charge pump and a second terminal of the first zener diode to the first region; and connecting a first terminal of a second zener diode to the charge pump and a second terminal of the zener diode to the second region.

20. A method of claim 17 wherein the step of connecting the gate of the bidirectional MOSFET further comprises:

connecting a first terminal of a second MOSFET to the charge pump and a second terminal of the second MOSFET to the gate of the bidirectional MOSFET;

connecting a first terminal of a first zener diode to a gate of the second MOSFET and a second terminal of the first zener diode to the first region; and connecting a first terminal of a second zener diode to the gate of the second MOSFET and a second terminal of the second zener diode to the second region.

21. A method of claim 17 wherein the step of connecting the gate of the bidirectional MOSFET further comprises:

connecting a first terminal of a first depletion-mode MOSFET to the charge pump and a gate of the first depletion-mode MOSFET to the second region; and connecting a first terminal of a second depletion-mode MOSFET to a second terminal of the first depletion-mode MOSFET, a gate of the second depletion-mode MOSFET to the first region, and a second terminal of the second depletion-mode MOSFET to the gate of the bidirectional MOSFET.

22. A method of claim 17 wherein the step of connecting the gate of the bidirectional MOSFET further comprises:

connecting a first terminal of a first depletion-mode MOSFET to the charge pump and a gate of the first depletion-mode MOSFET to the second region;

connecting a first terminal of a second depletion-mode MOSFET to a second terminal of the first depletion-mode MOSFET, a gate of the second depletion-mode MOSFET to the first region;

connecting a first terminal of a third MOSFET to the charge pump, a second terminal of the third MOSFET to the gate of the bidirectional MOSFET, and a gate of the third MOSFET to a second terminal of the second depletion-mode MOSFET.

* * * * *

UNITED STATES PATENT AND TRADEMARK OFFICE
CERTIFICATE OF CORRECTION

PATENT NO.    :   5,731,732
DATED         :   March 24, 1998
INVENTOR(S)   :   Williams, Richard K.

It is certified that error appears in the above-identified patent and that said Letters Patent is hereby corrected as shown below:

Column 13, line 50, (Claim 11), after "first" insert --depletion-mode--.

Column 14, line 11, (Claim 14), after "MOSFET" delete "," and insert --and--.

Column 15, line 2, (Claim 18), delete "an" and insert --a--.

Column 15, line 16, (Claim 19), after "the" insert --second--.

Column 16, line 21 (Claim 22), after "MOSFET" delete "," and insert --and--.

Signed and Sealed this

Twenty-ninth Day of September, 1998

Attest:

BRUCE LEHMAN

*Attesting Officer*            *Commissioner of Patents and Trademarks*